(12) United States Patent
Tsuchiya et al.

(10) Patent No.: US 10,775,326 B2
(45) Date of Patent: Sep. 15, 2020

(54) ELECTRON BEAM INSPECTION APPARATUS AND ELECTRON BEAM INSPECTION METHOD

(71) Applicant: NuFlare Technology, Inc., Yokohama-shi (JP)

(72) Inventors: Hideo Tsuchiya, Setagaya-ku (JP); Masataka Shiratsuchi, Kawasaki (JP); Ryoichi Hirano, Setagaya-ku (JP); Hideaki Hashimoto, Yokohama (JP); Riki Ogawa, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/292,466

(22) Filed: Mar. 5, 2019

(65) Prior Publication Data

US 2019/0277782 A1    Sep. 12, 2019

(30) Foreign Application Priority Data

Mar. 6, 2018    (JP) .................. 2018-039615

(51) Int. Cl.
*G01N 23/22*    (2018.01)
*G01N 23/2251*    (2018.01)
(Continued)

(52) U.S. Cl.
CPC ..... *G01N 23/2251* (2013.01); *G01N 23/2206* (2013.01); *H01J 37/265* (2013.01);
(Continued)

(58) Field of Classification Search
CPC .... H01J 37/28; H01J 37/265; H01J 2237/221; H01J 2237/2817; H01J 2237/004;
(Continued)

(56) References Cited

U.S. PATENT DOCUMENTS 6,979,820 B2 * 12/2005 Ke .................. G01N 23/2251
250/307
7,288,948 B2 * 10/2007 Hasegawa .......... G01N 23/225
324/754.22
(Continued)

FOREIGN PATENT DOCUMENTS

JP    2009-9882    1/2009

*Primary Examiner* — Wyatt A Stoffa
(74) *Attorney, Agent, or Firm* — Oblon, McClelland, Maier & Neustadt, L.L.P.

(57) ABSTRACT

An electron beam inspection apparatus includes an acquisition processing circuitry to acquire surface material information presenting a surface material of the substrate and a value of an acceleration voltage of an electron beam; a sequence determination processing circuitry to determine a scan sequence of a plurality of stripe regions on the basis of the surface material of the substrate and the value of the acceleration voltage, the plurality of stripe regions obtained by virtually dividing an inspection region of the substrate in a stripe shape; a secondary electron image acquisition mechanism including a detector for detecting a secondary electron and configured to scan the plurality of stripe regions of the substrate according to a determined scan sequence and to acquire a secondary electron image of the substrate; and a comparison processing circuitry to compare the secondary electron image with a corresponding reference image.

11 Claims, 11 Drawing Sheets

(51) Int. Cl.
  *G01N 23/2206* (2018.01)
  *H01J 37/26* (2006.01)
  *H01J 37/28* (2006.01)

(52) U.S. Cl.
  CPC ....... *G01N 2223/6116* (2013.01); *H01J 37/28* (2013.01); *H01J 2237/004* (2013.01); *H01J 2237/221* (2013.01); *H01J 2237/2817* (2013.01)

(58) Field of Classification Search
  CPC .............. G01N 21/22; G01N 23/2206; G01N 23/2251; G01N 2223/6116
  See application file for complete search history.

(56) References Cited

U.S. PATENT DOCUMENTS

| | | | |
|---|---|---|---|
| 7,439,504 B2* | 10/2008 | Hiroi | H01J 37/244 250/310 |
| 8,274,048 B2* | 9/2012 | Ikegami | G01N 23/225 250/306 |
| 9,659,746 B2* | 5/2017 | Nakamura | H01J 37/3005 |
| 2003/0007677 A1* | 1/2003 | Hiroi | G06T 7/001 382/149 |
| 2007/0040118 A1* | 2/2007 | Cheng | H01J 37/28 250/310 |
| 2009/0001267 A1* | 1/2009 | Enyama | H01J 37/28 250/310 |
| 2013/0313429 A1* | 11/2013 | Noji | H01J 37/04 250/307 |
| 2014/0367570 A1* | 12/2014 | Kimba | H01J 37/185 250/307 |
| 2015/0041644 A1* | 2/2015 | Tsuno | H01J 37/244 250/307 |
| 2016/0093466 A1* | 3/2016 | Mizoguchi | H01J 37/21 315/14 |
| 2017/0011884 A1* | 1/2017 | Nakamura | |
| 2018/0269032 A1* | 9/2018 | Cheng | H01J 37/28 |

* cited by examiner

# ELECTRON BEAM INSPECTION APPARATUS AND ELECTRON BEAM INSPECTION METHOD

CROSS-REFERENCE TO RELATED APPLICATION

This application is based upon and claims the benefit of priority from prior Japanese Patent Application No. 2018-039615 filed on Mar. 6, 2018 in Japan, the entire contents of which are incorporated herein by reference.

BACKGROUND OF THE INVENTION

Field of the Invention

The present invention relates to an electron beam inspection apparatus and an electron beam inspection method. For example, the invention relates to a technique for acquiring an inspection image by using multiple beams.

Related Art

In recent years, a circuit line width required for a semiconductor element becomes narrower in accordance with higher integration and larger capacity of a large scale integrated circuit (LSI). By using an original image pattern (which is a mask or reticle and will be hereinafter referred to as a mask) provided with a circuit pattern, the semiconductor element is manufactured by exposing and transferring the pattern to a wafer using a reduced projection exposure apparatus called a so-called stepper.

Then, it is essential to improve yield when manufacturing the LSI requiring a large manufacturing cost. However, as represented by one gigabit class random access memory (DRAM), a pattern constituting the LSI is on the order of submicron to nanometer. Recently, the dimension to be detected as a pattern defect is extremely small due to the miniaturization of the LSI pattern size formed on a semiconductor wafer. Thus, it is necessary to improve the accuracy of a pattern inspection apparatus for inspecting defects of an ultrafine pattern transferred to a semiconductor wafer. In addition, as one of major factors that decrease the yield, a pattern defect of a mask used for exposing and transferring an ultrafine pattern to a semiconductor wafer by a photolithography technique can be exemplified. For this reason, it is necessary to improve the accuracy of the pattern inspection apparatus for inspecting defects of a transfer mask used for manufacturing LSI.

As an inspection technique, there is known an inspection method which is performed by comparing a measurement image obtained by capturing a pattern formed on a substrate such as a semiconductor wafer or a lithography mask, design data, or a measurement image obtained by capturing the same pattern on the substrate. For example, as a pattern inspection method, there is known a "die to die (die-die) inspection method" which compares measurement image data obtained by capturing the same pattern at different places on the same substrate or a "die to database (die-database) inspection method" which generates design image data (reference image) on the basis of pattern design data and compares the design image data with a measurement image corresponding to measurement data obtained by capturing a pattern. In the inspection method of such an inspection apparatus, an inspection target substrate is placed on a stage and a light flux scans a target object with the movement of the stage so that the target object is inspected.

The inspection target substrate is irradiated with a light flux by a light source and an illumination optical system. Light transmitted through or reflected from the inspection target substrate forms an image on a sensor through an optical system. An image captured by the sensor is transmitted to a comparison circuit as measurement data. In the comparison circuit, the measurement data and the reference data are compared according to an appropriate algorithm after aligning the images. Then, when both data do not match, it is determined that a pattern defect exists.

In the above-described pattern inspection apparatus, a laser beam is irradiated to the inspection target substrate and a transmission image or a reflection image is captured to acquire an optical image. In contrast, an inspection apparatus which scans an inspection target substrate by an electron beam, detects a secondary electron emitted from the inspection target substrate in accordance with the irradiation of the electron beam, and acquires a pattern image is also being developed. Among the inspection apparatuses using the electron beam, an apparatus using multiple beams is also being developed (for example, see JP-A-2009-009882). When the substrate surface is captured by the irradiation of the electron beam, a problem arises in that a distorted image is obtained due to a charging effect. A charging state changes depending on the acceleration voltage of the electron beam to be irradiated and the discharge elapsed time from the past charging. Regarding the inspection of the substrate, the efficiency of the scanning operation is satisfactory when performing a technique of sequentially scanning inspection stripes obtained by virtually dividing a target inspection region in a stripe shape in a moving state. However, there is a problem that the charging by the precedent adjacent inspection stripe may influence the imaging of the subsequent adjacent inspection stripe.

BRIEF SUMMARY OF THE INVENTION

According to one aspect of the present invention, an electron beam inspection apparatus includes a stage used to place a substrate provided with a pattern thereon;

an acquisition processing circuitry configured to acquire surface material information presenting a surface material of the substrate and a value of an acceleration voltage of an electron beam;

a sequence determination processing circuitry configured to determine a scan sequence of a plurality of stripe regions on the basis of the surface material of the substrate and the value of the acceleration voltage, the plurality of stripe regions obtained by virtually dividing an inspection region of the substrate in a stripe shape;

a secondary electron image acquisition mechanism including a detector for detecting a secondary electron and configured to scan the plurality of stripe regions of the substrate according to a determined scan sequence and to acquire a secondary electron image of the substrate; and a comparison processing circuitry configured to compare the secondary electron image with a corresponding reference image.

According to another aspect of the present invention, an electron beam inspection method includes acquiring surface material information presenting a surface material of a substrate provided with a pattern and a value of an acceleration voltage of an electron beam;

determining a scan sequence of a plurality of stripe regions on the basis of the surface material of the substrate and the value of the acceleration voltage, the plurality of stripe regions obtained by virtually dividing an inspection region of the substrate in a stripe shape;

acquiring a secondary electron image of the substrate by scanning the plurality of stripe regions of the substrate according to the scan sequence determined; and comparing the secondary electron image with a corresponding reference image and outputting a comparison result.

According to further another aspect of the present invention, an electron beam inspection apparatus includes a stage used to place a substrate provided with a pattern thereon;

an acquisition processing circuitry configured to acquire surface material information presenting a surface material of the substrate and a value of an acceleration voltage of an electron beam;

a sequence determination processing circuitry configured to determine a scan sequence of a plurality of divided regions on the basis of the surface material of the substrate and the value of the acceleration voltage, the plurality of divided regions obtained by virtually dividing an inspection region of the substrate;

a secondary electron image acquisition mechanism including a detector for detecting a secondary electron and configured to scan the plurality of divided regions of the substrate according to a determined scan sequence and to acquire a secondary electron image of the substrate; and a comparison processing circuitry configured to compare the secondary electron image with a corresponding reference image.

DETAILED DESCRIPTION OF THE INVENTION

Hereinafter, an embodiment will describe an apparatus and a method capable of reducing or eliminating an influence of a charge on a substrate caused by the irradiation of electron beams and performing an inspection with an image having less distortion.

Further, in the embodiment below, the case of capturing a secondary electron image by irradiating an inspection target substrate with multiple beams by an electron beam will be described as an example of a technique of capturing a pattern formed on an inspection target substrate (acquiring an inspection target image). Here, the inspection target substrate may be irradiated with a single beam instead of multiple beams to capture the secondary electron image.

Embodiment 1

Figure 1:
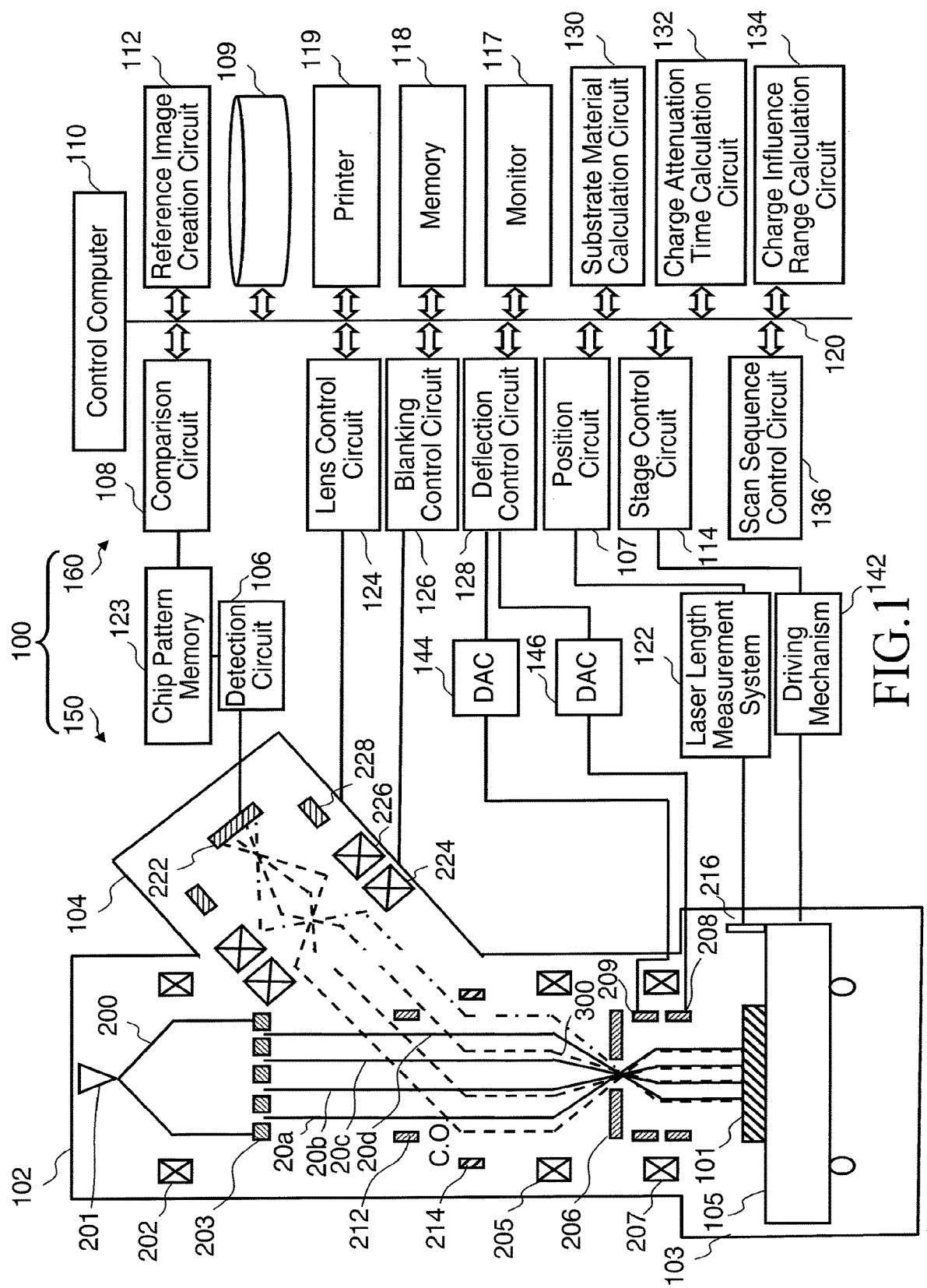
FIG. 1 is a configuration diagram illustrating a configuration of a pattern inspection apparatus of Embodiment 1.

FIG. 1 is a configuration diagram illustrating a configuration of a pattern inspection apparatus of Embodiment 1. In FIG. 1, an inspection apparatus 100 which inspects a pattern formed on a substrate is an example of an electron beam inspection apparatus. Further, the inspection apparatus 100 is an example of a multiple beams inspection apparatus. Further, the inspection apparatus 100 is an example of an electron beam image acquisition device. Further, the inspection apparatus 100 is an example of multiple beams image acquisition device. The inspection apparatus 100 includes an image acquisition mechanism 150 and a control circuit 160 (a control unit). The image acquisition mechanism 150 includes a main electron beam column 102, a sub-electron beam column 104, an inspection room 103, a detection circuit 106, a chip pattern memory 123, a driving mechanism 142, and a laser length measurement system 122. An electron gun assembly 201, an illumination lens 202, a shaping aperture array substrate 203, a reduction lens 205, a restriction aperture substrate 206, an objective lens 207, a main deflector 208, a sub-deflector 209, a collective blanking deflector 212, and a beam separator 214 are disposed in the main electron beam column 102. Projection lenses 224 and 226, a deflector 228, and a multiple detector 222 are disposed in the sub-electron beam column 104. The reduction lens 205, the restriction aperture substrate 206, the objective lens 207, the main deflector 208, the sub-deflector 209, and the collective blanking deflector 212 constitute a primary electron optics. Here, the configuration of the primary electron optics is not limited thereto. Other optical elements may be disposed. The beam separator 214, the projection lenses 224 and 226, and the deflector 228 constitute the secondary electron optics. Here, the configuration of the secondary electron optics is not limited thereto. Other optical elements may be disposed.

An XY stage 105 which is movable on at least the XY plane is disposed in the inspection room 103. A substrate 101 which is an inspection target is disposed on the XY stage 105. The substrate 101 includes an exposure mask substrate and a semiconductor substrate such as a silicon wafer. When the substrate 101 is the semiconductor substrate, a plurality of chip patterns (wafer dies) are formed on the semiconductor substrate. When the substrate 101 is the exposure mask substrate, a chip pattern is formed on the exposure mask substrate. The chip pattern is formed by a plurality of figures. When the chip pattern formed on such an exposure mask substrate is transferred onto the semiconductor substrate by exposure a plurality of times, a plurality of chip patterns (wafer dies) are formed on the semiconductor substrate. Hereinafter, a case in which the substrate 101 is the semiconductor substrate will be mainly described. For example, the substrate 101 is disposed on the XY stage 105 so that a pattern forming surface faces upward. Further, a mirror 216 which reflects a laser beam for laser length measurement emitted from the laser length measurement system 122 disposed outside the inspection room 103 is disposed on the XY stage 105. The multiple detector 222 is connected to the detection circuit 106 at the outside of the sub-electron beam column 104. The detection circuit 106 is connected to the chip pattern memory 123.

In the control circuit 160, a control computer 110 which controls the entire inspection apparatus 100 is connected to a position circuit 107, a comparison circuit 108, a reference image creation circuit 112, a stage control circuit 114, a lens control circuit 124, a blanking control circuit 126, a deflection control circuit 128, a substrate material calculation circuit 130, a charge attenuation time calculation circuit 132, a charge influence range calculation circuit 134, a scan sequence control circuit 136, a storage device 109 such as a magnetic disk drive, a monitor 117, a memory 118, and a printer 119 via a bus 120. Further, the deflection control circuit 128 is connected to Digital to Analog Conversion (DAC) amplifiers 144 and 146. The DAC amplifier 146 is connected to the main deflector 208 and the DAC amplifier 144 is connected to the sub-deflector 209.

Further, the chip pattern memory 123 is connected to the comparison circuit 108. Further, the XY stage 105 is driven by the driving mechanism 142 under the control of the stage control circuit 114. In the driving mechanism 142, for example, a driving system such as a three-axis (X-Y-θ) motor driven in the x direction, the y direction, and the θ direction is provided and the XY stage 105 is movable. As the X, Y, and θ motors (not illustrated), for example, a stepping motor can be used. The XY stage 105 is movable in the horizontal direction and the rotation direction by the X, Y, and θ motors. Then, the movement position of the XY stage 105 is measured by the laser length measurement system 122 and is supplied to the position circuit 107. The laser length measurement system 122 measures the position of the XY stage 105 by the principle of the laser interference method by receiving the light reflected from the mirror 216.

A high voltage power supply circuit (not illustrated) is connected to the electron gun assembly 201 and an acceleration voltage is applied from the high voltage power supply circuit across a drawn electrode and a filament (not illustrated) inside the electron gun assembly 201. Then, an electron group discharged from a cathode is accelerated by applying a voltage to a predetermined drawn electrode (Wehnelt) and heating the cathode at a predetermined temperature and is emitted as an electron beam 200. The illumination lens 202, the reduction lens 205, the objective lens 207, and the projection lenses 224 and 226 are configured as, for example, electromagnetic lenses and all of them are controlled by the lens control circuit 124. Further, the beam separator 214 is also controlled by the lens control circuit 124. Each of the collective blanking deflector 212 and the deflector 228 is formed as an electrode group of at least two poles and is controlled by the blanking control circuit 126. Each of the main deflector 208 and the sub-deflector 209 is formed as an electrode group of at least four poles and the main deflector 208 is controlled by the deflection control circuit 128 via the DAC amplifier 146 disposed in each electrode. Similarly, the sub-deflector 209 is formed as an electrode group of at least four poles and is controlled by the deflection control circuit 128 via the DAC amplifier 144 disposed in each electrode.

Here, a configuration necessary to describe Embodiment 1 is described in FIG. 1. Other configurations generally necessary in the inspection apparatus 100 may be provided.

Figure 2:
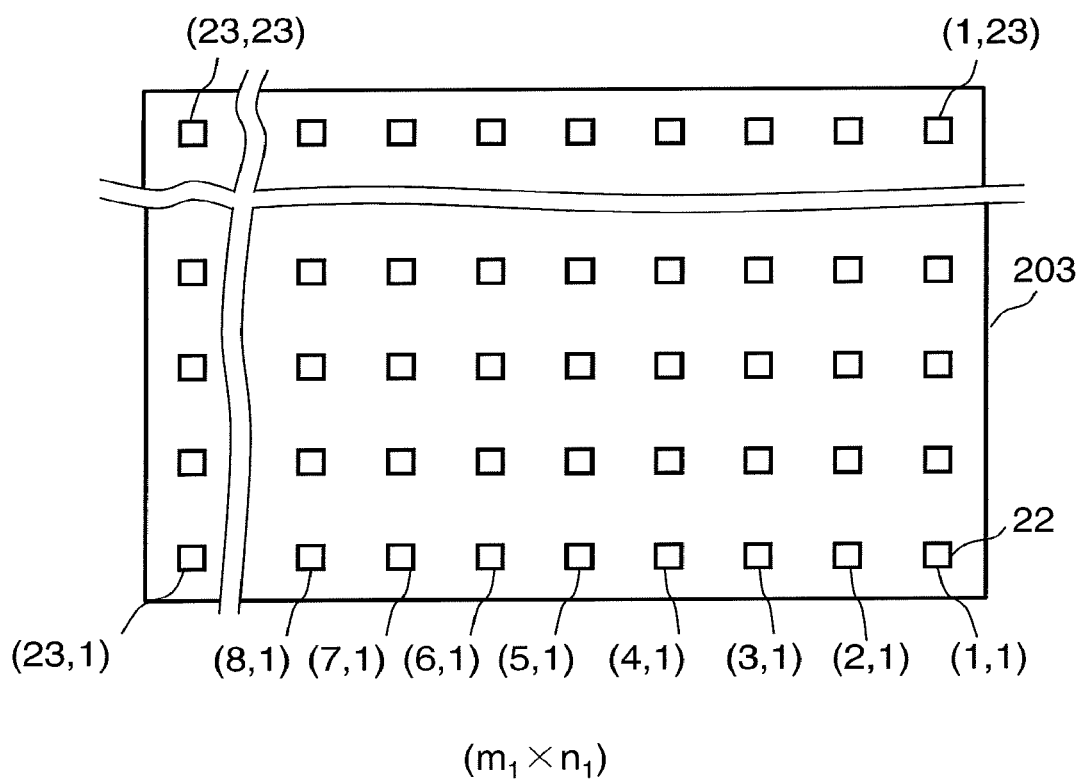
FIG. 2 is a conceptual diagram illustrating a configuration of a shaping aperture array substrate of Embodiment 1.
Figure 2:
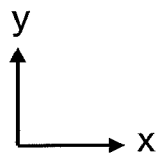

FIG. 2 is a conceptual diagram illustrating a configuration of a shaping aperture array substrate of Embodiment 1. As illustrated in FIG. 2, in the shaping aperture array substrate 203, holes (opening portions) 22 of $m_1$ rows in columns (the x direction)×$n_1$ stages in rows (the y direction) in two dimensions ($m_1$ and $n_1$ are integers of 2 or more) are formed at a predetermined arrangement pitch in the x and y directions inside a multiple beam forming region 204. The example of FIG. 2 illustrates a case in which 23×23 holes (opening portions) 22 are formed. Each hole 22 is formed in a rectangular shape having the same dimension. Alternatively, these holes may be formed in a circular shape having the same outer diameter. Multiple beams 20 (primary multiple electron beams) are formed by letting portions of an electron beam 200 individually pass through a corresponding one of a plurality of holes 22. Here, an example in which two rows or more holes 22 are arranged in the width and length directions (the x and y directions) is illustrated, but the invention is not limited thereto. For example, any one of the width and length direction (the x and y directions) may have a plurality of rows and the other thereof may have only one row. Further, the method of arranging the holes 22 is not limited to a case in which the holes are arranged in a lattice shape in the width and length directions as illustrated in FIG. 2. For example, the hole of the k-th stage in row and the hole of the k+1-th stage in row in the length direction (the y direction) may be arranged to be deviated by a dimension a in the width direction (the x direction). Similarly, the hole of the k+1-th stage in row and the hole of the k+2-th stage in row in the length direction (the y direction) may be arranged to be deviated by a dimension b in the width direction (the x direction). When a plurality of beams are formed at one time, the beams may be formed with other arrangement relationships.

The image acquisition mechanism 150 acquires an inspection target image of the figure from the substrate 101 provided with the figure by using multiple beams 20 with the electron beam. Hereinafter, an operation of the image acquisition mechanism 150 of the inspection apparatus 100 will be described.

The electron beam 200 which is emitted from the electron gun assembly 201 (the emission source) illuminates the entire shaping aperture array substrate 203 in a substantially perpendicular direction by the illumination lens 202. As illustrated in FIG. 2, the shaping aperture array substrate 203 is provided with a plurality of rectangular holes 22 (opening portions) and the electron beam 200 illuminates a region including all of the plurality of holes 22. For example, a plurality of rectangular (including square) electron beams (multiple beams) 20a to 20e (indicated by a solid line of FIG. 1) are formed by letting portions of the electron beam 200, which irradiates the positions of a plurality of holes 22, individually pass through a corresponding one of the plurality of holes 22 in the shaping aperture array substrate 203. The surface of the substrate 101 (the target object) are irradiated with the formed multiple beams 20a to 20d by the primary electron optics. Specifically, the operation is as below.

Then, the formed multiple beams 20a to 20d form a crossover (C.O.), pass through beam separators 214 disposed at the crossover positions of respective beams of the multiple beams 20, are reduced in size by the reduction lens 205, and advance toward the center hole formed in the restriction aperture substrate 206. Here, when all of the multiple beams 20a to 20d are deflected together by the collective blanking deflector 212 disposed between the shaping aperture array substrate 203 and the reduction lens 205, the beams are deviated from the center hole of the restriction aperture substrate 206 and are blocked by the restriction aperture substrate 206. Meanwhile, the multiple beams 20a to 20d which are not deflected by the collective blanking deflector 212 pass through the center hole of the restriction aperture substrate 206 as illustrated in FIG. 1. The blanking control is performed by the ON/OFF operation of the collective blanking deflector 212 so that the beam ON/OFF state is controlled together. In this way, the restriction aperture substrate 206 blocks the multiple beams 20a to 20d which are deflected to become a beam OFF state by the collective blanking deflector 212. Then, the multiple beams 20a to 20d for inspection are formed by a beam group formed from the beam ON state to the beam OFF state and passing through the restriction aperture substrate 206. The multiple beams 20a to 20d passing through the restriction aperture substrate 206 are focused onto the surface of the substrate 101 by the objective lens 207 to become a pattern image (a beam diameter) having a desired reduction ratio and all of the multiple beams 20 passing through the restriction aperture substrate 206 are deflected together in the same direction by the main deflector 208 and the sub-deflector 209 to be respectively irradiated the irradiation positions of the beams on the substrate 101. In such a case, all of the multiple beams 20 are deflected together to the reference position of the mask die, which is scanned by the multiple beams 20, by the main deflector 208. In Embodiment 1, for example, a scanning operation is performed while the XY stage 105 is continuously moved. For this reason, the main deflector 208 further performs tracking deflection so as to follow the movement of the XY stage 105. Then, all of the multiple beams 20 are deflected together by the sub-deflector 209 so that the beams respectively scan the corresponding regions. The multiple beams 20 which are irradiated at one time are ideally arranged at a pitch obtained by multiplying the arrangement pitch of the plurality of holes 22 of the shaping aperture array substrate 203 by the desired reduction ratio (1/a). In this way, the main electron beam column 102 irradiates the substrate 101 with the multiple beams 20 of $m_1 \times n_1$ in two dimensions at one time. Since a desired position of the substrate 101 are irradiated with the multiple beams 20, a secondary electron bundle (secondary multiple electron beams 300) (indicated by a dotted line in FIG. 1) including reflected electrons and corresponding each beam of the multiple beams 20 is emitted from the substrate 101.

The secondary multiple electron beams 300 which are emitted from the substrate 101 are bent to the center side of the secondary multiple electron beams 300 by the objective lens 207 and advance toward the center hole formed in the restriction aperture substrate 206. The secondary multiple electron beams 300 passing through the restriction aperture substrate 206 are bent to be substantially parallel to the optical axis by the reduction lens 205 and advance toward the beam separator 214.

Here, the beam separator 214 generates an electric field and a magnetic field in an orthogonal direction on a surface which is orthogonal to the advancing direction (the optical axis) of the multiple beams 20. The electric field exerts a force with respect to electrons in the same direction regardless of the advancing direction of electrons. In contrast, the magnetic field exerts a force with respect to electrons according to Fleming's left-hand rule. For this reason, it is possible to change the direction of the force acting on electrons by the penetration direction of electrons. In the multiple beams 20 (the primary electron beams) penetrating the beam separator 214 from above, a force caused by the electric field and a force caused by the magnetic field cancel each other and hence the multiple beams 20 advance straightly downward. In contrast, in the secondary multiple electron beams 300 permeating the beam separator 214 from below, a force caused by the electric field and a force caused by the magnetic field are exerted in the same direction and hence the secondary multiple electron beams 300 are bent obliquely upward.

The secondary multiple electron beams 300 are guided together by the secondary electron optics. Specifically, the operation is as below. The secondary multiple electron beams 300 which are bent obliquely upward are guided to the multiple detector 222 while being bent by the projection lenses 224 and 226. The guided secondary multiple electron beams 300 are projected to the multiple detector 222. The multiple detector 222 detects the projected secondary multiple electron beams 300.

Figure 3:
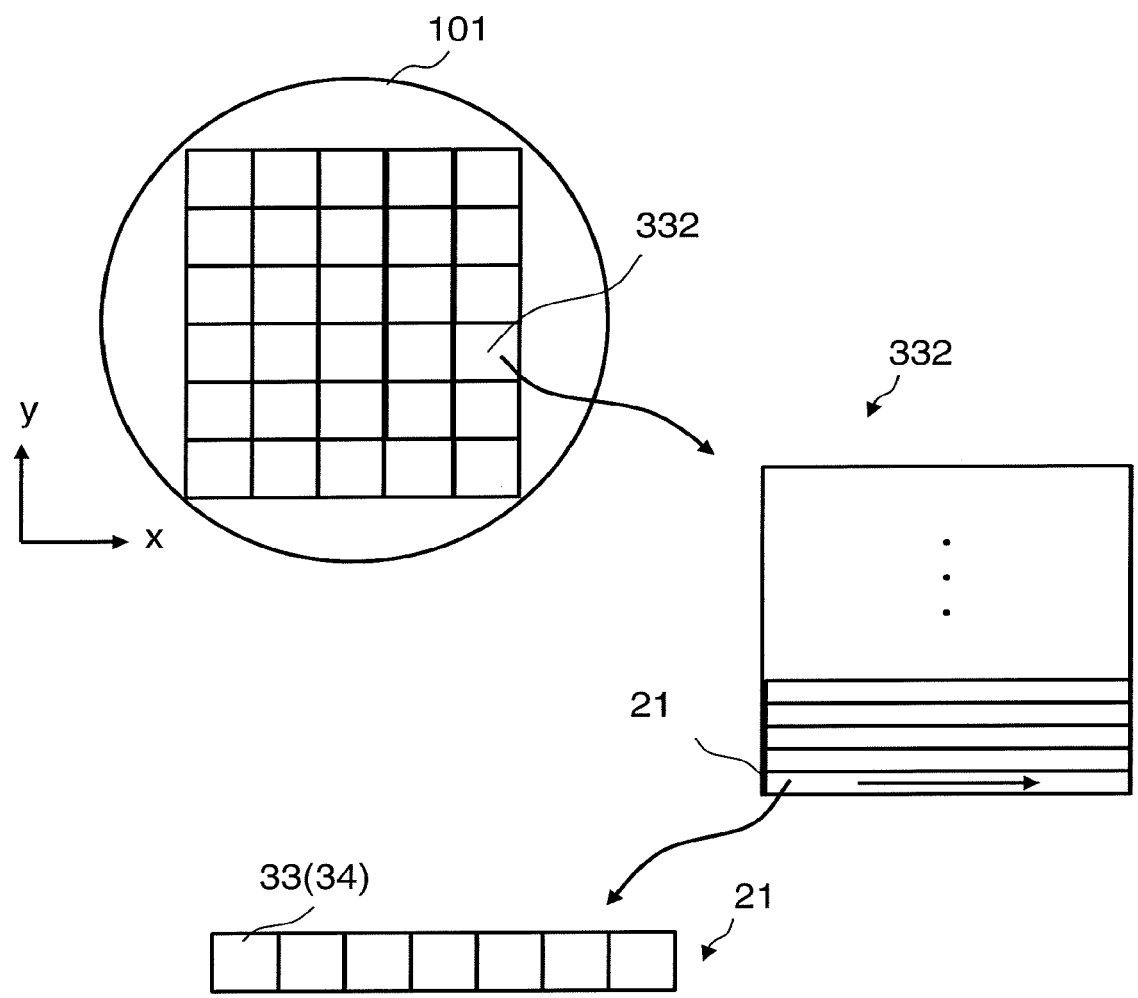
FIG. 3 is a diagram illustrating an example of a plurality of chip regions formed on a semiconductor substrate of Embodiment 1.

FIG. 3 is a diagram illustrating an example of a plurality of chip regions formed on a semiconductor substrate of Embodiment 1. In FIG. 3, when the substrate 101 is the semiconductor substrate (the wafer), a plurality of chips (wafer dies) 332 are formed in a two-dimensional array shape on the semiconductor substrate (the wafer). A mask pattern for one chip formed on the exposure mask substrate is transferred to each chip 332 while being reduced to, for example, ¼ by an exposure apparatus (a stepper) (not illustrated). The chip region of each chip 332 is divided into a plurality of stripe regions 21 having a stripe shape in the y direction with the same size as, for example, an irradiation region 34 which can be irradiated with the multiple beams 20. The irradiation region 34 which can be irradiated with the multiple beams 20 once is defined by (the x direction size obtained by multiplying the number of beams in the x direction by the pitch between the beams in the x direction of the multiple beams 20 on the surface of the substrate 101)×(the y direction size obtained by multiplying the number of beams in the y direction by the pitch between the beams in the y direction of the multiple beams 20 on the surface of the substrate 101). In the example of FIG. 3, a case in which the width (the y direction size) of the stripe region 21 is the same as the y direction size of the irradiation region 34 is illustrated. However, the invention is not limited thereto. The width (the y direction size) of the stripe region 21 may be larger than the y direction size of the irradiation region 34. For example, it is preferable that the width (the y direction size) of the stripe region 21 is set to a natural multiple of the y direction size of the irradiation region 34. In Embodiment 1, the stripe images are acquired by the scanning (scanning operation) for each stripe region 21. Furthermore, each stripe region 21 may be divided while partially overlapping each other in order to prevent omission of image acquisition.

Further, each stripe region 21 is divided in the x direction into the same size as that of, for example, the irradiation region 34. For this reason, the inside of each chip 332 is divided into, for example, a plurality of image acquisition regions 33 of $m_2$ rows in columns (the x direction)×$n_2$ stages in rows (the y direction) in two dimensions ($m_2$ and $n_2$ are integers of 2 or more). In Embodiment 1, such an image acquisition region 33 becomes a unit inspection region.

Figure 4:
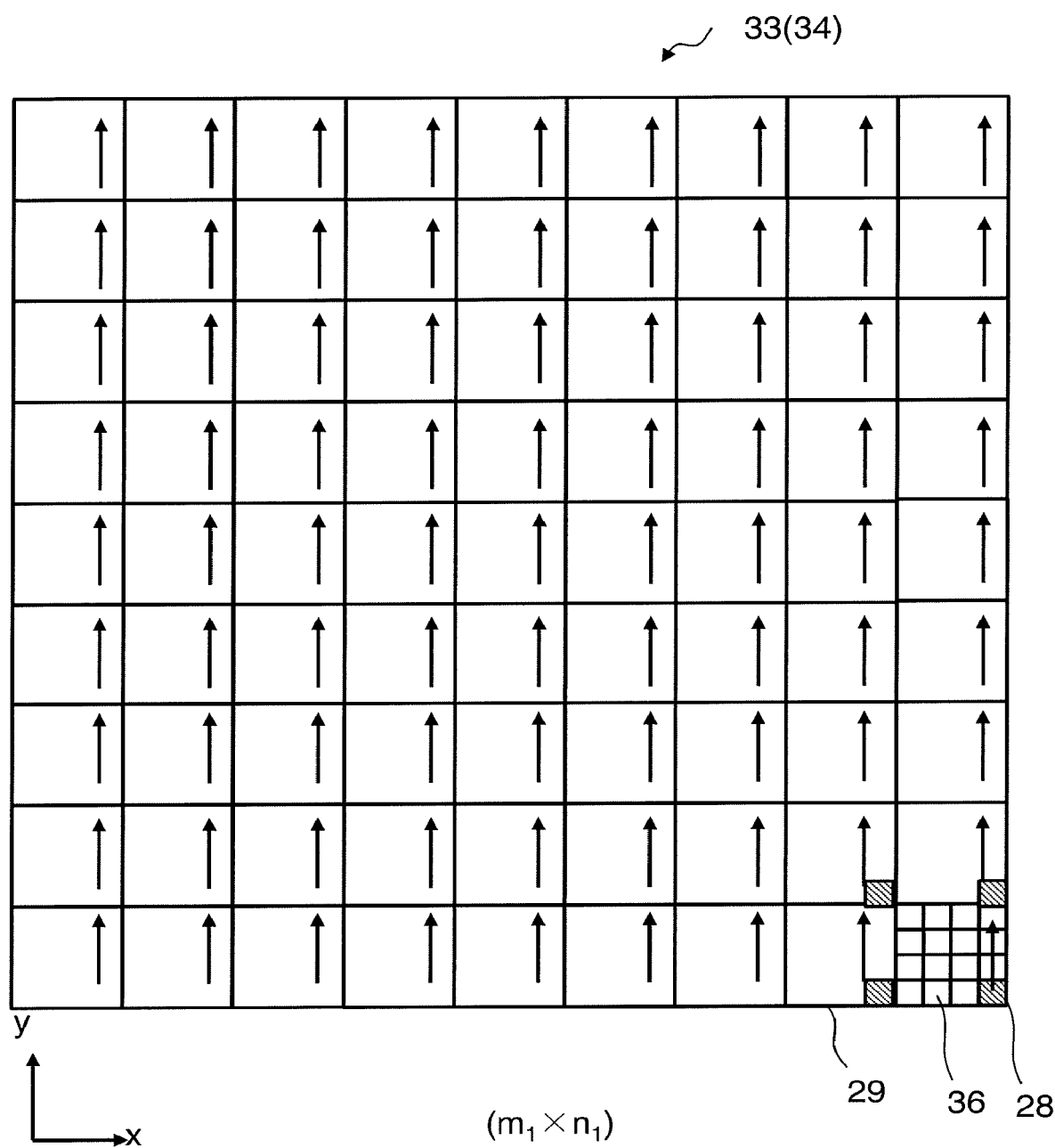
FIG. 4 is a diagram illustrating an example of a measurement pixel and multiple beams irradiation region of Embodiment 1.

FIG. 4 is a diagram illustrating an example of a multiple beam irradiation region and a measurement pixel of Embodiment 1. In FIG. 4, each image acquisition region 33 is divided into, for example, a plurality of mesh-shaped mesh regions with a beam size of multiple beams. Each of the mesh regions corresponds to a measurement pixel 36 (a unit irradiation region). The example of FIG. 4 illustrates the case of multiple beams of 9×9 rows. The example of FIG. 4 illustrates a case in which the irradiation region 34 has the same size as that of the image acquisition region 33. However, the invention is not limited thereto. The irradiation region 34 may be smaller or larger than the image acquisition region 33. Then, a plurality of measurement pixels 28 (the irradiation positions of the beams at one shot) that can be irradiated with the multiple beams 20 once are illustrated in the irradiation region 34. In other words, a pitch between the adjacent measurement pixels 28 corresponds to a pitch between the beams of the multiple beams. In the example of FIG. 4, one sub-irradiation region 29 is formed by a square region surrounded by four adjacent measurement pixels 28 and including one measurement pixel 28 of four measurement pixels 28. The example of FIG. 4 illustrates a case in which each sub-irradiation region 29 is formed by 4×4 measurement pixels 36.

In the scanning operation of Embodiment 1, the scanning is performed for each stripe region 21. The example of FIG. 4 illustrated an example of a case in which one image acquisition region 33 in a certain stripe region 21 is scanned. In a case in which all of the multiple beams 20 are used, the sub-irradiation regions 29 of $m_1 \times n_1$ are arranged in the x and y directions (in two dimensions) in one irradiation region 34. The XY stage 105 is moved to a position which can be irradiated with the multiple beams 20 in the first image acquisition region 33. Then, the tracking deflection is performed by the main deflector 208 in accordance with the movement of the XY stage 105 and the inside of the image acquisition region 33 is scanned by the sub-deflector 209 while using the image acquisition region 33 as the irradiation region 34 in a tracking deflection state. Each beam constituting the multiple beams 20 is in charge of one of the mutually different sub-irradiation regions 29. Then, at each shot, one measurement pixel 28 corresponding to the same position in the assigned sub-irradiation region 29 is irradiated with each beam. In the example of FIG. 4, each beam is deflected by the sub-deflector 209 to be irradiated from the right side of the lowest stage in the assigned sub-irradiation region 29 to the first measurement pixel 36 at a first shot. Then, the irradiation for the first shot is performed. Next, the beam deflection positions of all of the multiple beams 20 are collectively shifted by one measurement pixel 36 in the y direction by the sub-deflector 209 and the first measurement pixel 36 from the right side of the second stage from the lower side in the assigned sub-irradiation region 29 is irradiated with the beam at a second shot. Similarly, the first measurement pixel 36 from the right side of the third stage from the lower side in the assigned sub-irradiation region 29 is irradiated with the beam at a third shot. Then, the first measurement pixel 36 from the right side of the fourth stage from the lower side in the assigned sub-irradiation region 29 is irradiated with the beam at a fourth shot. Next, the beam deflection positions of all of the multiple beams 20 are collectively shifted by the sub-deflector 209 to the position of the second measurement pixel 36 from the right side of the lowest stage. Then, in the same way, the measurement pixels 36 are sequentially irradiated with the beam in they direction. By repeating such an operation, all measurement pixels 36 in one sub-irradiation region 29 are sequentially irradiated with one beam. At one shot, the secondary multiple electron beams 300 corresponding to a plurality of beam shots as many as the holes 22 to maximum are detected at one time by the multiple beams formed while passing through the holes 22 of the shaping aperture array substrate 203.

As described above, all of the multiple beams 20 are used for the scanning by using the image acquisition region 33 as the irradiation region 34, but the beams respectively scan each corresponding sub-irradiation region 29. Then, when the scanning of one image acquisition region 33 ends, for example, the adjacent subsequent image acquisition region 33 is scanned while moving to a position in which the adjacent subsequent image acquisition region 33 in the x direction becomes the irradiation region 34. By repeating such an operation, the scanning of each stripe region 21 is performed. Due to each shot of the multiple beams 20, the secondary electron beams are emitted from the irradiated measurement pixel 36 at each time and are detected by the multiple detector 222. In Embodiment 1, in the unit detection region size of the multiple detector 222, the secondary electron beams emitted upward from each measurement pixel 36 are detected for each measurement pixel 36 (or each sub-irradiation region 29).

As described above, when the scanning is performed by using the multiple beams 20, it is possible to perform the scanning operation (measurement) at a high speed as compared with the case of performing a scanning operation by a single beam. Furthermore, each stripe region 21 may be scanned by a step-and-repeat operation or each stripe region 21 may be scanned while continuously moving the XY stage 105. In a case in which the irradiation region 34 is smaller than the image acquisition region 33, the scanning operation may be performed while moving the irradiation region 34 in the image acquisition region 33.

In a case in which the substrate 101 is an exposure mask substrate, the chip region corresponding to one chip formed on the exposure mask substrate is divided into, for example, a plurality of stripe regions in the form of a stripe shape of the size of the above-described image acquisition region 33. Then, each image acquisition region 33 may be scanned by the same scanning operation as that of the above-described operation for each stripe region. Since the size of the image acquisition region 33 of the exposure mask substrate is a size before the transferring, the size becomes four times the image acquisition region 33 of the semiconductor substrate. For this reason, when the irradiation region 34 is smaller than the image acquisition region 33 of the exposure mask substrate, the scanning operation increases by one chip (for example, four times). However, since the accuracy required for the exposure mask substrate is reduced by the reduction ratio, the size of the measurement pixel is enlarged four times by changing the reduction/enlargement magnification of the main electron beam column/sub-electron column by four times. Accordingly, since the size of the irradiation region 34 is enlarged, it is possible to inspect a region four times as large as the same scan number.

As described above, the image acquisition mechanism 150 scans an inspection target substrate 101 provided with a figure for each stripe region 21 by using the multiple beams 20 and detects the secondary multiple electron beams 300 emitted from the inspection target substrate 101 due to the irradiation of the multiple beams 20.

Here, when the surface of the substrate 101 is captured by the irradiation of the electron beam as described above, a problem arises in that a distorted image is acquired due to the charging effect. The charging state changes in accordance with the acceleration voltage of the electron beam to be irradiated and the discharge elapse time from the past charging. In the inspection of the substrate 101, it is possible to obtain high efficiency in the scanning operation when performing a technique of sequentially and continuously scanning the stripe region 21 in a moving state, as described above. However, there is a problem that the charging by the precedent adjacent stripe region 21 may influence the imaging of the immediately subsequent stripe region 21. Therefore, in Embodiment 1, the scanning operation of each stripe region 21 is performed so as not to be influenced by the charging generated in the peripheral stripe region 21. Therefore, the operation is as follows.

Figure 5:
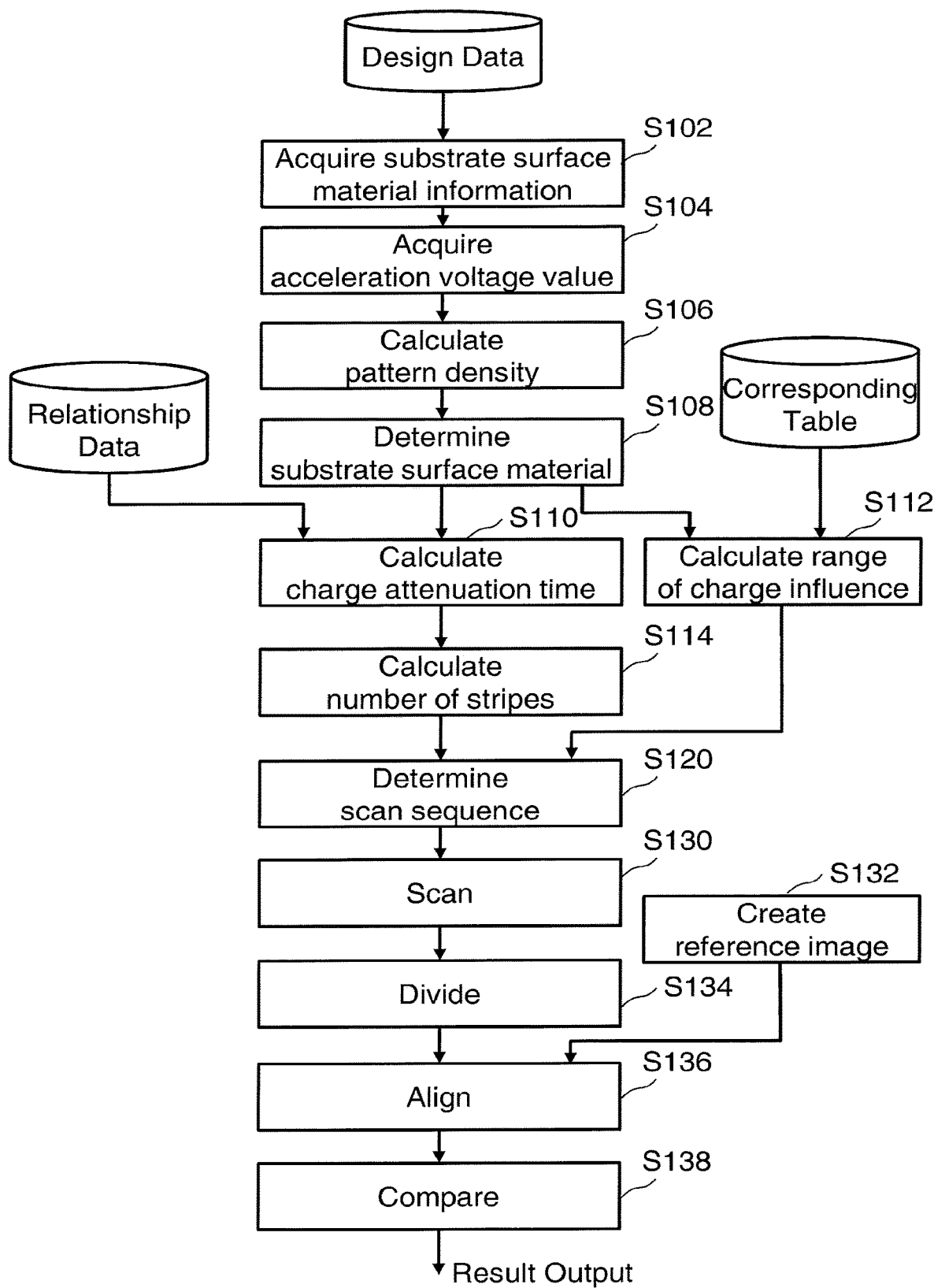
FIG. 5 is a flowchart illustrating main steps of an inspection method of Embodiment 1.

FIG. 5 is a flowchart illustrating main steps of an inspection method of Embodiment 1. In FIG. 5, the inspection method of Embodiment 1 performs a series of steps including a substrate surface material information acquisition step (S102), an acceleration voltage value acquisition step (S104), a pattern density calculation step (S106), a substrate surface material determination step (S108), a charge attenuation time calculation step (S110), a charge influence range calculation step (S112), a stripe number calculation step (S114), a scan sequence determination step (S120), a scan step (S130), a reference image creation step (S132), a division step (S134), a position alignment step (S136), and a comparison step (S138).

Figure 6:
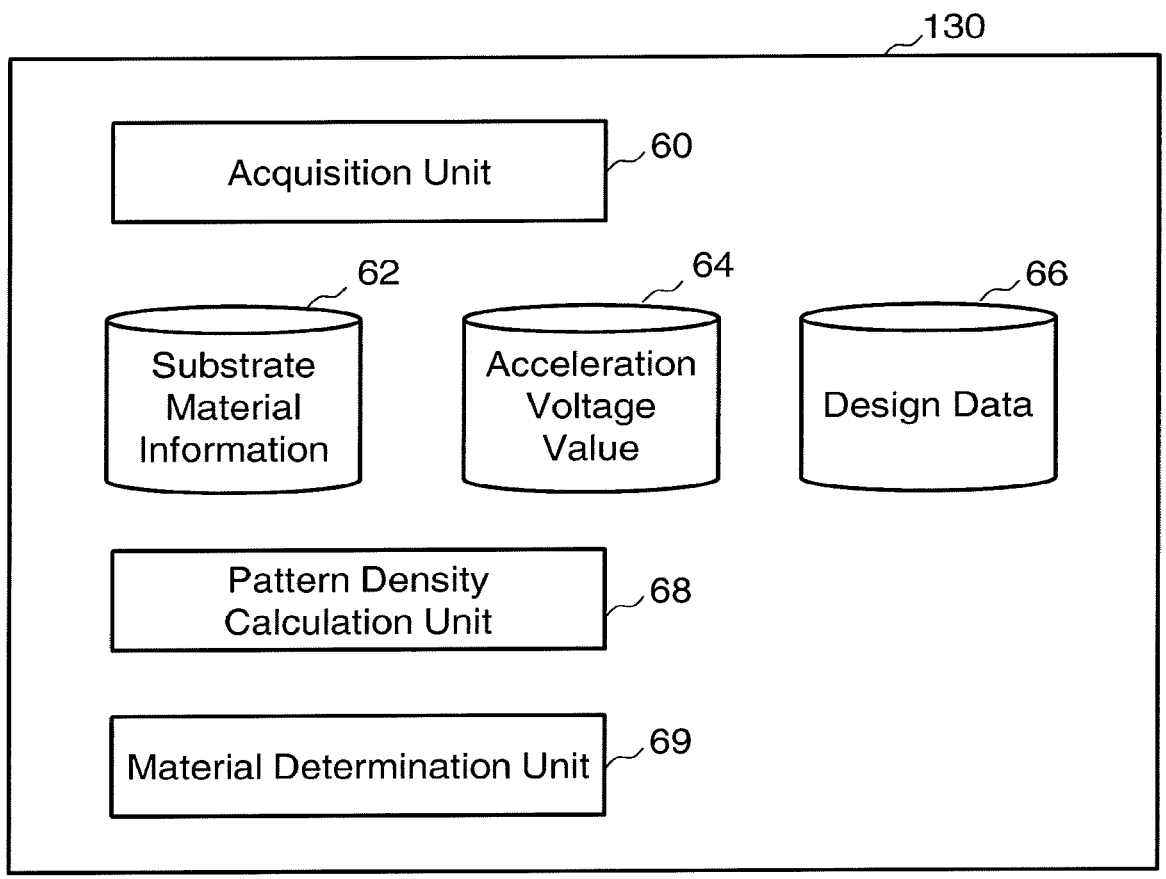
FIG. 6 is a block diagram illustrating an example of an internal configuration of a substrate material calculation circuit of Embodiment 1.

FIG. 6 is a block diagram illustrating an example of an internal configuration of a substrate material calculation circuit of Embodiment 1. In FIG. 6, storage devices 62, 64, and 66 such as a magnetic disk drive, an acquisition unit 60, a pattern density calculation unit 68, and a material determination unit 69 are disposed inside the substrate material calculation circuit 130. Each "unit" such as the acquisition unit 60, the pattern density calculation unit 68, and the material determination unit 69 includes a processing circuitry. Such a processing circuitry includes, for example, an electric circuit, a computer, a processor, a circuit board, a quantum circuit, or a semiconductor device. Each "unit" may use a common processing circuitry (the same processing circuitry) or different processing circuitries (separate processing circuitryies). Information which is input to and output from the acquisition unit 60, the pattern density calculation unit 68, and the material determination unit 69 and information used for calculation are stored in a memory (not illustrated) or the memory 118 at each time.

Figure 7:
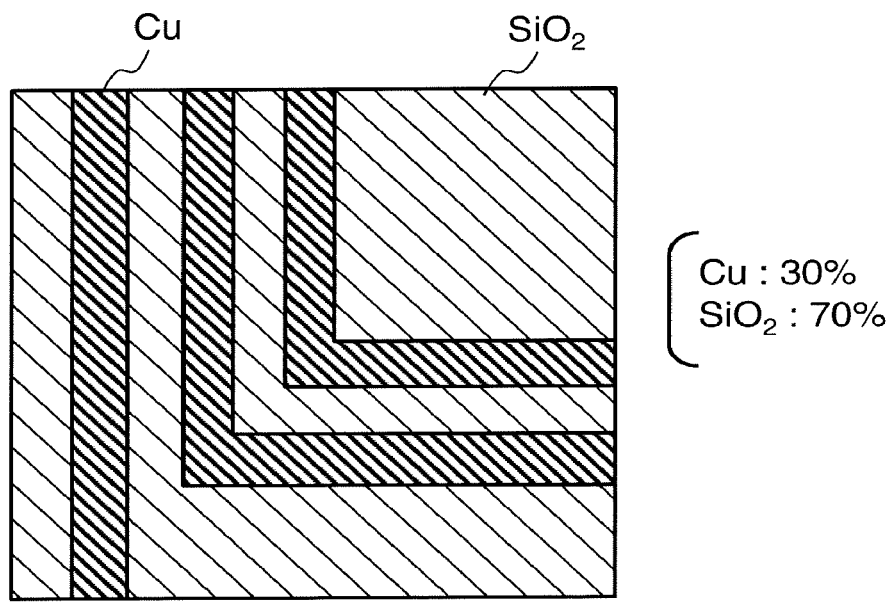
FIG. 7 is a diagram illustrating an example of a pattern of a substrate surface of Embodiment 1.

FIG. 7 is a diagram illustrating an example of a substrate surface pattern of Embodiment 1. The example of FIG. 7 illustrates an example of a pattern which is formed by a silicon oxide film ($SiO_2$) and copper (Cu) on the surface of the substrate 101 of the inspection target. Thus, in the example of FIG. 7, Cu and $SiO_2$ are exemplified as the surface material of the substrate 101. Information on the surface material of the substrate 101 may be input from the outside of the inspection apparatus 100 in advance and may be stored in, for example, the storage device 109. The storage device 109 stores design data which is the basis for forming a pattern on the substrate 101 or design pattern data defined by exposure image data of the pattern formed on the substrate 101. Then, such design data or design pattern data is output to the substrate material calculation circuit 130 and is stored in the storage device 66 under the control of the control computer 110.

As the substrate surface material information acquisition step (S102), the acquisition unit 60 reads and acquires information (surface material information) presenting the surface material of the substrate 101 stored in the storage device 109 in each stripe region 21. The acquired surface material information of the substrate 101 is stored in the storage device 62. Thus, in the example of FIG. 7, information that the surface material of the substrate 101 is Cu and $SiO_2$ is acquired by the acquisition unit 60.

As the acceleration voltage value acquisition step (S104), the acquisition unit 60 reads and acquires the value of the acceleration voltage of the electron beam 200 in each stripe region 21. The acquired acceleration voltage value is stored in the storage device 64. An acceleration voltage value V' of the electron beam 200 actually used to acquiring an image may be input from a high voltage power supply circuit (not illustrated) for the electron gun assembly 201 and may be stored in, for example, the storage device 109. Furthermore, since the value of the acceleration voltage is not generally changed for each stripe region 21, the value can be used for other stripe regions 21 when the value is acquired once. Further, the acquired acceleration voltage value V' is output to the charge attenuation time calculation circuit 132 and the charge influence range calculation circuit 134.

As the pattern density calculation step (S106), the pattern density calculation unit 68 reads the design data which is the basis for forming a pattern on the substrate 101 or the design pattern data defined by the exposure image data of the pattern formed on the substrate 101 from the storage device 66 in each stripe region 21 and calculates the pattern density of the pattern formed on the substrate 101 on the basis of the design data or the design pattern data.

As the substrate surface material determination step (S108), the material determination unit 69 determines the substrate surface material of the stripe region 21 by using the acquired surface material information of the substrate 101 and the pattern density of the pattern formed on the substrate 101 calculated in each stripe region 21. The example of FIG. 7 illustrates a case in which a ratio of a wiring pattern formed of Cu is 30% and a ratio of an insulation film pattern formed of $SiO_2$ is 70%. Thus, in the example of FIG. 7, Cu of 30% and $SiO_2$ of 70% are determined as the surface material of the substrate 101. The determination result is output to the charge attenuation time calculation circuit 132 and the charge influence range calculation circuit 134.

Figure 8:
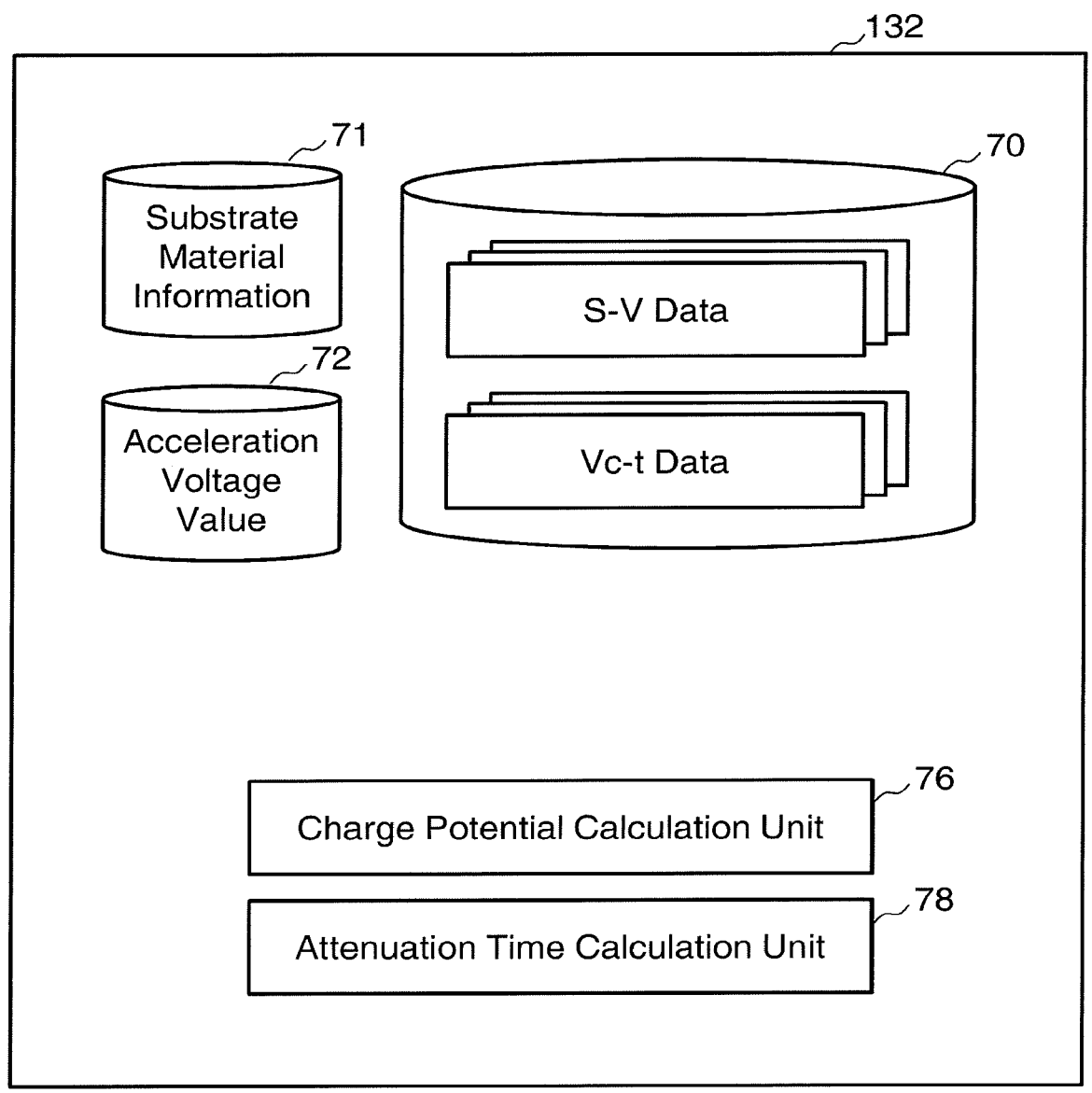
FIG. 8 is a block diagram illustrating an example of an internal configuration of a charge attenuation time calculation circuit of Embodiment 1.

FIG. 8 is a block diagram illustrating an example of an internal configuration of a charge attenuation time calculation circuit of Embodiment 1. In FIG. 8, storage devices 70, 71, and 72 such as a magnetic disk drive, a charge potential calculation unit 76, and an attenuation time calculation unit 78 are disposed in the charge attenuation time calculation circuit 132. Each "unit" such as the charge potential calculation unit 76 and the attenuation time calculation unit 78 includes a processing circuitry. Such a processing circuitry includes, for example, an electric circuit, a computer, a processor, a circuit board, a quantum circuit, or a semiconductor device. Each "unit" may use a common processing circuitry (the same processing circuitry) or different processing circuitries (separate processing circuitries). Information which is input to and output from the charge potential calculation unit 76 and the attenuation time calculation unit 78 and information used for calculation are stored in a memory (not illustrated) or the memory 118 at each time.

In the charge attenuation time calculation circuit 132, the input surface material of the substrate 101 in the stripe region 21 is stored in the storage device 71. Further, the input acceleration voltage value V' is stored in the storage device 72.

As the charge attenuation time calculation step (S110), the charge attenuation time calculation circuit 132 calculates the attenuation time t of the charge amount in accordance with the irradiation of the electron beam 200 on the basis of the surface material of the substrate 101 and the acceleration voltage value of the electron beam (here, the multiple beams 20). Hereinafter, a detailed operation will be described.

Figure 9:
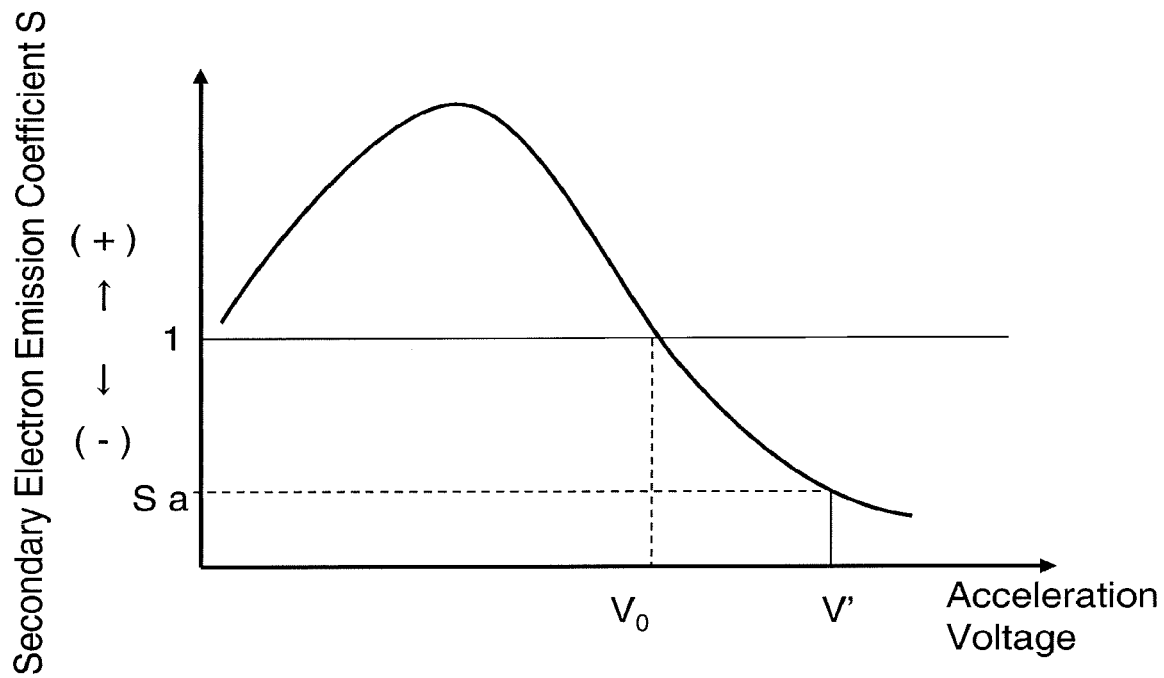
FIG. 9 is a diagram showing a relationship between a charged electric charge amount and an acceleration voltage of Embodiment 1.

FIG. 9 is a diagram showing a relationship between secondary electron emission coefficient and an acceleration voltage of Embodiment 1. In FIG. 9, a vertical axis indicates the secondary electron emission coefficient (SEEC) and a horizontal axis indicates the acceleration voltage V. Due to a difference between the number of electrons irradiated to the substrate 101 and the number of electrons emitted from the substrate 101, the upper surface of the substrate 101 is positively or negatively charged. The secondary electron emission coefficient is defined by the number of the secondary electrons emitted per each incident electron. Thus, the charge amount becomes zero in the case of 1. A positively charged state is set in the case of a value larger than 1 and a negatively charged state is set in the case of a value smaller than 1.

Depending on the acceleration voltage V of the electron beam (here, the multiple beams 20) with which irradiated the substrate 101, the secondary electron emission coefficient at the irradiation position of the substrate 101 changes. As the acceleration voltage increases, it becomes a positively charged state at the initial time. Then, when the acceleration voltage further increases more than a peak, the secondary electron emission coefficient gradually decreases and it becomes a non-charge state (a value of 1). When the acceleration voltage further increases, it becomes a negatively charged state later. Then, when the acceleration voltage further increases, it converges to a negatively charged state. In such a relationship, the value becomes different in accordance with the material irradiated with the electron beam, but the value is substantially the same. Since the type of material to be used in the surface of the substrate 101 is given in advance depending on whether the inspection target substrate 101 is a semiconductor wafer or an exposure mask substrate, in the case of Embodiment 1, the relationship data (S-V data) between the secondary electron emission coefficient S and the acceleration voltage V is obtained in advance by an experiment or simulation for each of a plurality of materials to be used in the surface of the substrate 101 and the S-V data is input from the outside of the inspection apparatus 100 and is stored in the storage device 70.

The charge potential calculation unit 76 calculates the potential Vcs (or Vc) based on the charge amount of the corresponding stripe region 21 in each stripe region 21. Specifically, the calculation is as follows. The charge potential calculation unit 76 first reads the acceleration voltage value V' actually used to acquire an image from the storage device 72. Then, the charge potential calculation unit 76 calculates the secondary electron emission coefficient Sa of the acceleration voltage value V' to be actually used in each of the surface material of the substrate 101 in the stripe region 21 by referring to the relationship data (S-V data) between the acceleration voltage V and the secondary electron emission coefficient S for each target material. Then, the charge potential calculation unit 76 calculates the potential Vcs (or Vc) based on the charge amount by using the secondary electron emission coefficient Sa and the ratio of the area of each material of the surface of the substrate 101 in the stripe region 21. Furthermore, since the entire stripe region 21 is not charged at the same time, but is sequentially charged according to the scanning operation, it is preferable to divide the stripe region 21 into a plurality of small regions (for example, the image acquisition regions 33) and to calculate the potential Vc based on the charge amount for each small region. Hereinafter, an example of a detailed calculation technique will be described.

The influence on the sampled image due to the charging is considered as a phenomenon that a potential difference ΔV between the potential generated by the charging of the surface of the substrate 101 and the potential in a non-charged state influences the orbit of electrons incident to the substrate 101 so that the sampled image is distorted. The charging energy U can be defined by the following Equation (1) using an electrostatic capacitance C and a charge amount Q of the substrate 101.

$$U=(1/2) \cdot (Q^2/C) \tag{1}$$

However, since a direct influence on the orbit of electrons is caused by the potential difference ΔV generated by the charging, it is preferable to use ΔV as an index.

For this reason, the secondary electron emission coefficient (SEEC) Sa for a material 1 used in the surface of the substrate 101 at the actual acceleration voltage V' is first calculated by referring to the relationship data of FIG. 9. For the sake of simplicity, the case of scanning an image acquisition region by a single beam and sampling an image will be described. At that time, the following terms are indicated as below.

Incident beam current: Ib
Image acquisition region scan time: ts
Electrostatic capacitance per unit area of substrate: Cs
Area of image acquisition region: Ss
Charge elementary quantity: qec When the image acquisition region is scanned by a single beam, the number of electrons ei injected to the substrate within a scan time can be defined by the following Equation (2).

$$ei=(Ib \cdot ts/qec) \tag{2}$$

Then, the number of electrons ee contributing to the charging can be defined by the following Equation (3). Furthermore, the sign of the secondary electron emission coefficient Sa at the actual acceleration voltage V' indicates the charging direction (positive or negative direction).

$$ee=(1-Sa) \cdot ei \tag{3}$$

Further, in a case in which a pattern is formed on the substrate 101 by a different material 2, the secondary electron emission coefficient Sa2 at the actual acceleration voltage V' is calculated by referring to the relationship data between the acceleration voltage and the secondary electron emission coefficient of such material 2. In such a case, when an area ratio of the pattern formed of the material 1 included in the image acquisition region corresponding to a target is indicated by ps, the number of electrons eee contributing to the charging can be defined by the following Equation (4).

$$eee=ei \cdot ps \cdot (1-Sa)+ei \cdot (1-ps) \cdot (1-Sa2) \tag{4}$$

Thus, the potential Vc generated on the basis of the charge amount (charging energy) accumulated in the image acquisition region corresponding to a target can be defined by the following Equation (5) on the basis of the above-described parameter.

$$Vc=f(Ib,ts,Cs,Ss,Sa,Sa2,ps) \tag{5}$$

Next, the potential Vcs based on the charge amount until an image of the stripe region is sampled when a substrate placed on the XY stage is scanned in one direction (X) can be defined by the following Equation (6) by using a time tss for scanning one stripe region 21. Here, for the sake of simplicity, the potential in one stripe region 21 in accordance with the scanning is assumed to be uniform.

$$V_{cs}=g(V_c, t_{ss}) \quad (6)$$

Next, the attenuation time calculation unit 78 calculates an attenuation time t until the potential Vcs based on the charge amount obtained by the charging of the stripe region 21 in each stripe region 21 is attenuated.

Figure 10:
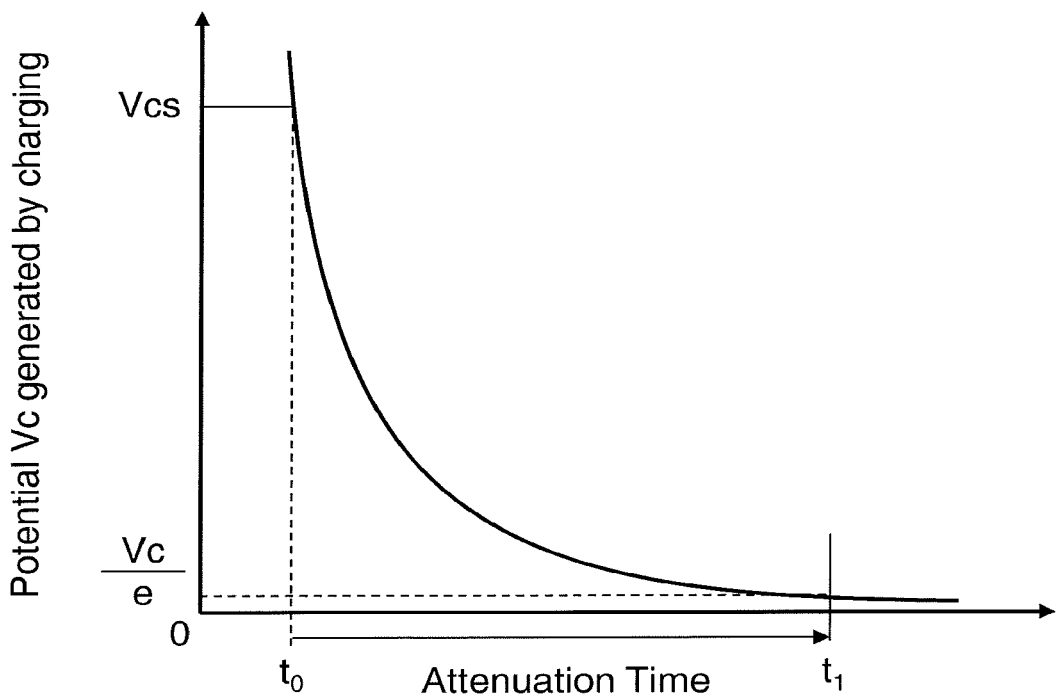
FIG. 10 is a diagram showing a relationship between charging energy and an attenuation time of Embodiment 1.

FIG. 10 is a diagram showing a relationship between the attenuation time and the potential generated by the charging of Embodiment 1. In FIG. 10, a vertical axis indicates the potential Vc generated by charging and a horizontal axis indicates the attenuation time t. The charging energy obtained by the charging of a certain region is attenuated with time due to the discharging and converges toward 0 (no charge). Such a relationship becomes different according to the material irradiated with the electron beam. For example, in a material having a high dielectric constant, the attenuation of the charging energy becomes slow. However, each material has substantially the same tendency. Therefore, in Embodiment 1, the relationship data (Vc-t data) between the potential Vc generated by the charging and the attenuation time t for each material of a plurality of materials to be used in the surface of the substrate 101 is obtained in advance by an experiment, simulation, or the like and the Vc-t data is input from the outside of the inspection apparatus 100 and is stored in the storage device 70.

The attenuation time calculation unit 78 calculates the attenuation time t for each material taken from a position (time t0) of the calculated potential Vcs to a position (time t1) in which the potential difference between the potential Vcs and the potential of the non-charge state converges to the potential (for example, Vc/e) not influencing the distortion of the image by referring to the Vc-t data for each material corresponding to a target. Further, since the Vc-t data is different according to the material as described above, the calculated attenuation time t is different. Therefore, the attenuation time calculation unit 78 may calculate a value interpolated in response to the ratio of each material of the surface of the substrate 101 in the stripe region 21 as the attenuation time t in the stripe region 21. Furthermore, since the entire stripe region 21 is not charged at the same time, but is sequentially charged according to the scanning operation, it is preferable to calculate the attenuation time t for each of the small regions by dividing the stripe region 21 into a plurality of small regions (for example, the image acquisition regions 33). Then, the attenuation time calculation unit 78 may calculate, for example, a time from a time point in which the irradiation of the multiple beams 20 to the stripe region 21 ends to a time point until the attenuation of the charging of the entire stripe region 21 ends as the attenuation time t of the stripe region 21 by using the attenuation time calculated for each of the small regions. Accordingly, it is preferable not to scan other stripe regions 21 in the range of charge influence to be described later until the attenuation time t elapses after the scanning of the stripe region 21 ends. The attenuation time t calculated for each stripe region 21 is output to the scan sequence control circuit 136.

As the charge influence range calculation step (S112), the charge influence range calculation circuit 134 (influence range calculation unit) calculates the range of charge influence in accordance with the irradiation of the electron beam (here, the multiple beams 20) on the basis of the surface material of the substrate 101 and an acceleration voltage value V1.

Figure 11:
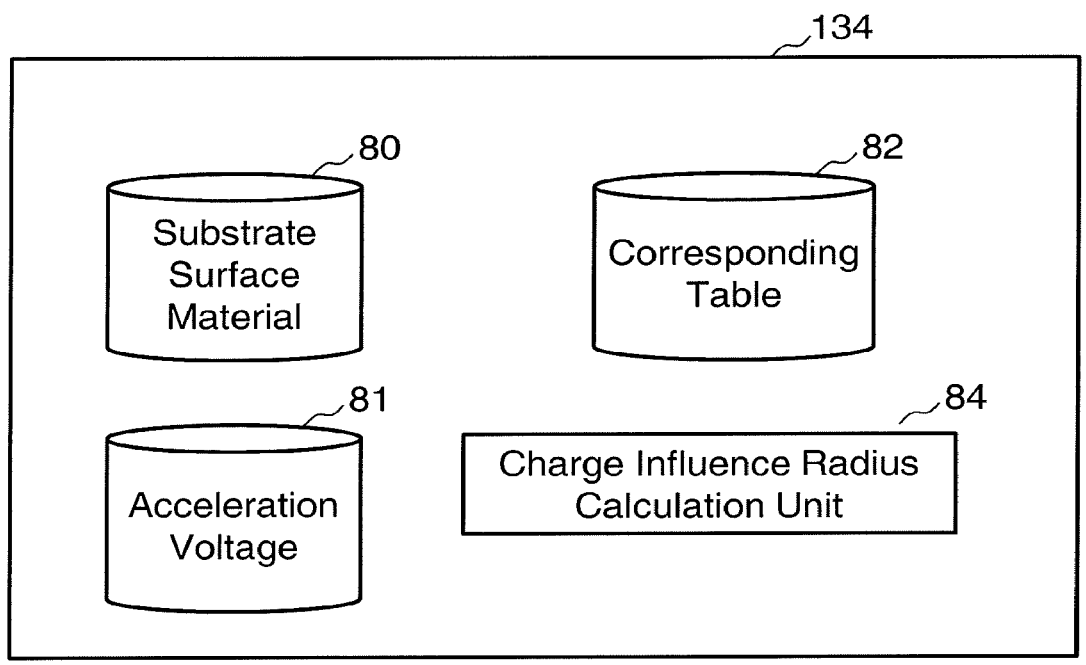
FIG. 11 is a block diagram illustrating an example of an internal configuration of a charge influence range calculation circuit of Embodiment 1.

FIG. 11 is a block diagram illustrating an example of an internal configuration of a charge influence range calculation circuit 134 of Embodiment 1. In FIG. 11, storage devices 80, 81, and 82 such as magnetic disk drive and a charge influence radius calculation unit 84 are arranged in the charge influence range calculation circuit 134. The charge influence radius calculation unit 84 includes a processing circuitry. Such a processing circuitry includes, for example, an electric circuit, a computer, a processor, a circuit board, a quantum circuit, or a semiconductor device. Information which is input to and output from the charge influence radius calculation unit 84 and information used for calculation are stored in a memory (not illustrated) or the memory 118 at each time.

In the charge influence range calculation circuit 134, the input surface material of the substrate 101 in the stripe region 21 is stored in the storage device 80. Further, the input acceleration voltage value V' is stored in the storage device 81. Further, a charge influence radius r corresponding to the surface material of the substrate 101 and the acceleration voltage value V' is obtained in advance by simulation or the like and a corresponding table is created. Such a corresponding table is input from the outside of the inspection apparatus 100 and is stored in the storage device 82.

The charge influence radius calculation unit 84 reads information on the surface material of the substrate 101 in the stripe region 21 from the storage device 80, reads the acceleration voltage value V' from the storage device 81, and calculates the charge influence radius r corresponding to the acceleration voltage value V' and the surface material of the substrate 101 in the stripe region 21 by referring to the corresponding table stored in the storage device 82.

Figure 12:
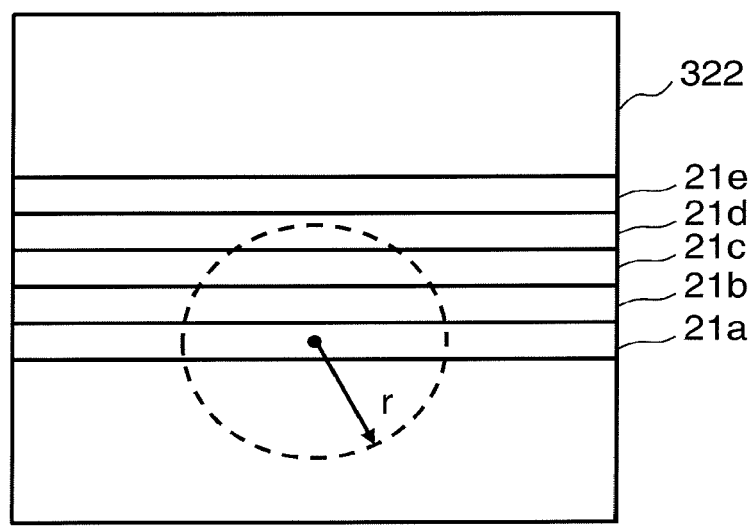
FIG. 12 is a diagram illustrating an example of a range of charge influence of Embodiment 1.

FIG. 12 is a diagram illustrating an example of a range of charge influence of Embodiment 1. FIG. 12 illustrates a state in which the chip 332 is divided into the plurality of stripe regions 21. Then, the charge influence radius r which illustrates an influence on the image acquiring operation due to the charging generated in the stripe region 21a when a certain stripe region 21a are irradiated with the multiple beams 20 is illustrated. In the example of FIG. 12, the charging of the stripe region 21a influences three continuously adjacent stripe regions 21b, 21c, and 21d. Thus, it is preferable not to scan three continuously adjacent stripe regions 21b, 21c, and 21d until the charging of the stripe region 21a is attenuated and terminated. The charge influence radius r calculated for each stripe region 21 is output to the scan sequence control circuit 136.

Figure 13:
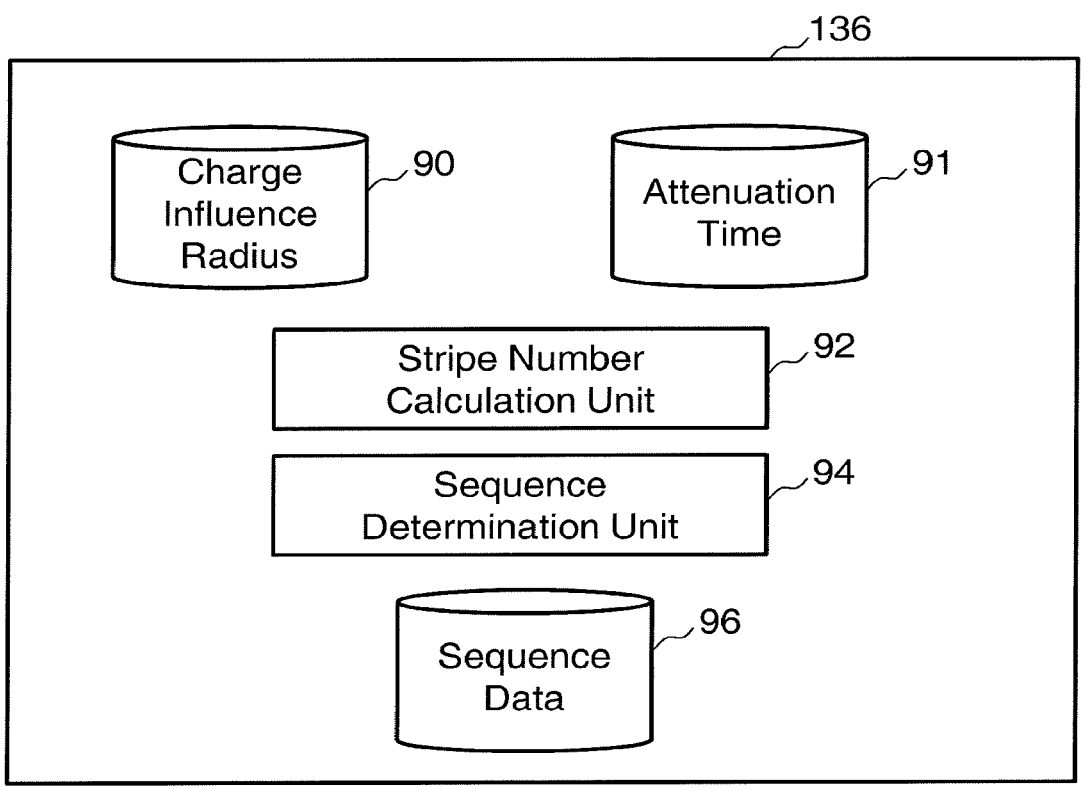
FIG. 13 is a block diagram illustrating an example of an internal configuration of a scan sequence control circuit of Embodiment 1.

FIG. 13 is a block diagram illustrating an example of an internal configuration of the scan sequence control circuit 136 of Embodiment 1. In FIG. 13, storage devices 90, 91, and 96 such as a magnetic disk drive, a stripe number calculation unit 92, and a sequence determination unit 94 are disposed in the scan sequence control circuit 136. Each "unit" such as the stripe number calculation unit 92 and the sequence determination unit 94 includes a processing circuitry. Such a processing circuitry includes, for example, an electric circuit, a computer, a processor, a circuit board, a quantum circuit, or a semiconductor device. Each "unit" may use a common processing circuitry (same processing circuitry) or different processing circuitries (separate processing circuitries). Information which is input to and output from the stripe number calculation unit 92 and the sequence determination unit 94 and information used for calculation are stored in a memory (not illustrated) or the memory 118 at each time.

In the scan sequence control circuit 136, the input charge influence radius r of each stripe region 21 is stored in the storage device 90. Further, the input attenuation time t of each stripe region 21 is stored in the storage device 91.

As the stripe number calculation step (S114), the stripe number calculation unit 92 calculates the number of stripes to be scanned until the attenuation time t elapses in the stripe region 21 in each stripe region 21. Here, the attenuation time t is read from the storage device 91 in each stripe region 21 and the number of stripes to be scanned until the attenuation time t of the stripe region 21 elapses from a time point in which the scanning operation of the stripe region 21 ends is calculated. For example, when n number of stripe regions 21 can be scanned until the attenuation time t elapses, the number of stripes is calculated as n. Furthermore, the time necessary for scanning one stripe region 21 may be obtained in response to the movement speed of the XY stage 105. Thus, for example, when n number of other stripe regions 21 are scanned after the scanning operation of the stripe region 21a ends, the charging of the stripe region 21 is attenuated and terminated in the meantime. Further, for example, when a scan sequence is set to perform the scanning operation of n number of other stripe regions 21 until the charging is attenuated and terminated after the scanning operation of the stripe region 21a ends, it is possible to obtain an efficient image by suppressing wasteful time.

As the scan sequence determination step (S120), the sequence determination unit 94 determines the scan sequence of the plurality of stripe regions 21 on the basis of the surface material of the substrate 101 and the value V1 of the acceleration voltage, the plurality of stripe regions 21 being obtained by virtually dividing the inspection region of the substrate 101 in a stripe shape. The sequence determination unit 94 determines the scan sequence so that a number of strips of other stripe regions calculated in the stripe number calculation step (S114) are interposed between the target stripe region for determining the sequence and the adjacent stripe region adjacent to the target stripe region. Further, the sequence determination unit 94 determines the scan sequence so that the stripe regions in the range of charge influence are not continuous.

Figure 14:
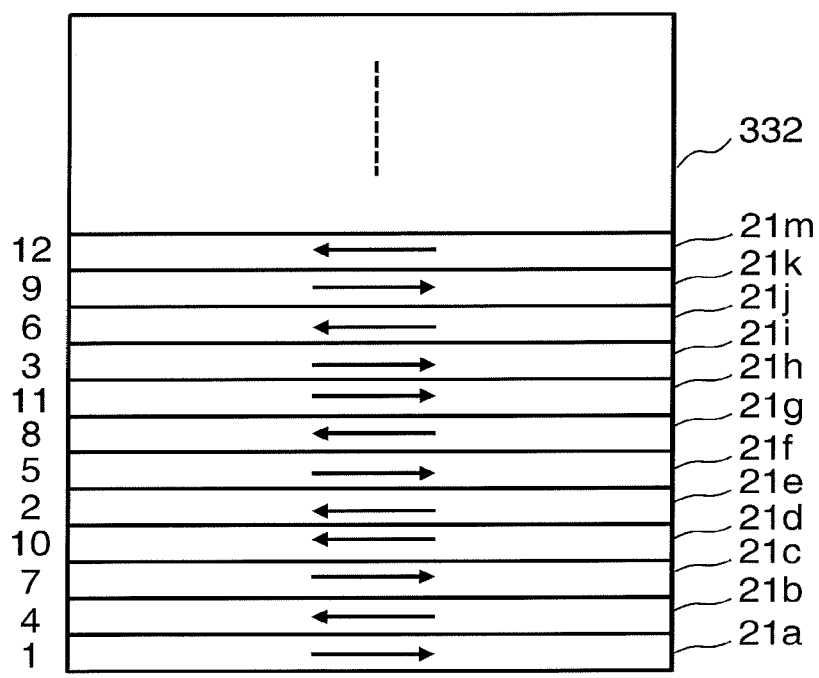
FIG. 14 is a diagram illustrating an example of a stripe region scan sequence of Embodiment 1.

FIG. 14 is a diagram illustrating an example of a scan sequence of a stripe region of Embodiment 1. The example of FIG. 14 illustrates the stripe regions 21a to 21m in the plurality of stripe regions 21 in the chip 332. Further, the example of FIG. 14 illustrates a case in which the number of stripes to be scanned until the attenuation time t of the stripe region 21 elapses is three. Further, the example of FIG. 14 illustrates a case in which the range of charge influence of the stripe region 21 is continuous so that three adjacent stripe regions are formed. In such a case, as a first scan sequence, the stripe region 21a at the lowest stage is scanned in the +x direction. Since it is necessary to select the stripe region separated by four or more from the stripe region 21a, the stripe region 21e at the fifth stage from the lower side is scanned in the −x direction as a second scan sequence. In the same way, since it is necessary to select the stripe region separated by four or more from the stripe region 21e, the stripe region 21i at the ninth stage from the lower side is scanned in the +x direction as a third scan sequence. During such a scanning operation, the charging of the stripe region 21a of the first scan sequence is attenuated and terminated. Thus, it is possible to scan the stripe region adjacent to the stripe region 21a. Therefore, the stripe region 21b at the second stage from the lower side is scanned in the −x direction as a fourth scan sequence. Next, the stripe region 21f at the sixth stage from the lower side is scanned in the +x direction as a fifth scan sequence. Next, as a sixth scan sequence, the stripe region 21j at the tenth stage from the lower side is scanned in the −x direction. During such a scanning operation, the charging of the stripe region 21b of the fourth scan sequence is attenuated and terminated. Therefore, as a seventh scan sequence, the stripe region 21c at the third stage from the lower side is scanned in the +x direction. Next, as an eighth scan sequence, the stripe region 21g at the seventh stage from the lower side is scanned in the −x direction. Next, as a ninth scan sequence, the stripe region 21k at the eleventh stage from the lower side is scanned in the +x direction. During such a scanning operation, the charging of the stripe region 21c of the seventh scan sequence is attenuated and terminated. Therefore, as a tenth scan sequence, the stripe region 21d at the fourth stage from the lower side is scanned in the −x direction. Next, as an eleventh scan sequence, the stripe region 21h at the eighth stage from the lower side is scanned in the +x direction. Next, as a twelfth scan sequence, the stripe region 21m at the twelfth stage from the lower side is scanned in the +x direction. In the example of FIG. 14, when the scan sequence is determined as described above, twelve continuous stripe regions 21 can be scanned without the influence of the charging. After this, the same operations may be performed repeatedly. The determined scan sequence data is stored in the storage device 96.

As the scan step (S130), the image acquisition mechanism 150 (the secondary electron image acquisition mechanism) scans the plurality of stripe regions 21 of the substrate 101 according to a determined scan sequence and acquires the secondary electron image of the substrate 101. Specifically, as described above, the image acquisition mechanism 150 scans the inspection target substrate 101 provided with a figure for each stripe region 21 according to a determined scan sequence by using the multiple beams 20 and detects the secondary multiple electron beams 300 emitted from the inspection target substrate 101 due to the irradiation of the multiple beams 20. The secondary electron detection data (measurement image, the secondary electron image, or the inspection target image) from each measurement pixel 36 detected by the multiple detector 222 is output to the detection circuit 106 according to a measurement sequence. In the detection circuit 106, analog detection data is converted into digital data by an A/D converter (not illustrated) and is stored in the chip pattern memory 123. In this way, the image acquisition mechanism 150 acquires the measurement image of the pattern formed on the substrate 101. Then, for example, the detection data of one chip 332 (or one stripe region 21) is transmitted to the comparison circuit 108 along with information indicating each position from the position circuit 107 as the chip pattern data (or stripe data) at an accumulation stage.

As the reference image creation step (S132), the reference image creation circuit 112 creates a reference image for each mask die on the basis of the design data based on the pattern formed on the substrate 101 or the design pattern data defined by the exposure image data of the pattern formed on the substrate 101. Specifically, the operation is as follows. First, the design pattern data is read from the storage device 109 through the control computer 110 and each figure defined by the read design pattern data is converted into binary or multi-value image data.

Here, the figure defined by the design pattern data is, for example, a figure based on a rectangle or a triangle. For example, figure data defining a shape, a size, a position, and the like of each pattern figure defined by information such as a coordinate (x, y) at the reference position of the figure, a length of the side, and a figure code corresponding to an index for distinguishing the figure type such as a rectangle or a triangle is stored.

When the design pattern data corresponding to such figure data is input to the reference image creation circuit 112, the data expands to the figure data for each figure and a figure code, a figure dimension, and the like indicating the figure shape of the figure data are analyzed. Then, as a pattern to be arranged in a grid having a grid shape of a predetermined quantization dimension as a unit, binary or multi-value design pattern image data is expanded and output. In other words, the design data is read, an occupying ratio of the figure in the design pattern of each grid obtained by virtually dividing the inspection region as a grid having a unit of a predetermined dimension is calculated, and n-bit occupying ratio data is output. For example, it is preferable to set one grid as one pixel. Then, when one pixel has a resolution of $1/2^8$ (=$1/256$) a small region of $1/256$ corresponding to the region of the figure disposed in the pixel is allocated and an occupying ratio in the pixel is calculated. Then, the result is output as an 8-bit occupying ratio data to the reference image creation circuit 112. Such a grid (inspection pixel) may be aligned to the pixel of the measurement data.

Next, the reference image creation circuit 112 performs an appropriate filter process on the design image data of the design pattern which is the figure image data. Since the optical image data corresponding to the measurement image is in a state in which the filter is operated by the optical system, in other words, in the analog state which continuously changes, a filter process is applied to the design image data in which the image intensity (gray value) is a digital value to be adjusted to the measurement data. The image data of the created reference image is output to the comparison circuit 108.

Figure 15:
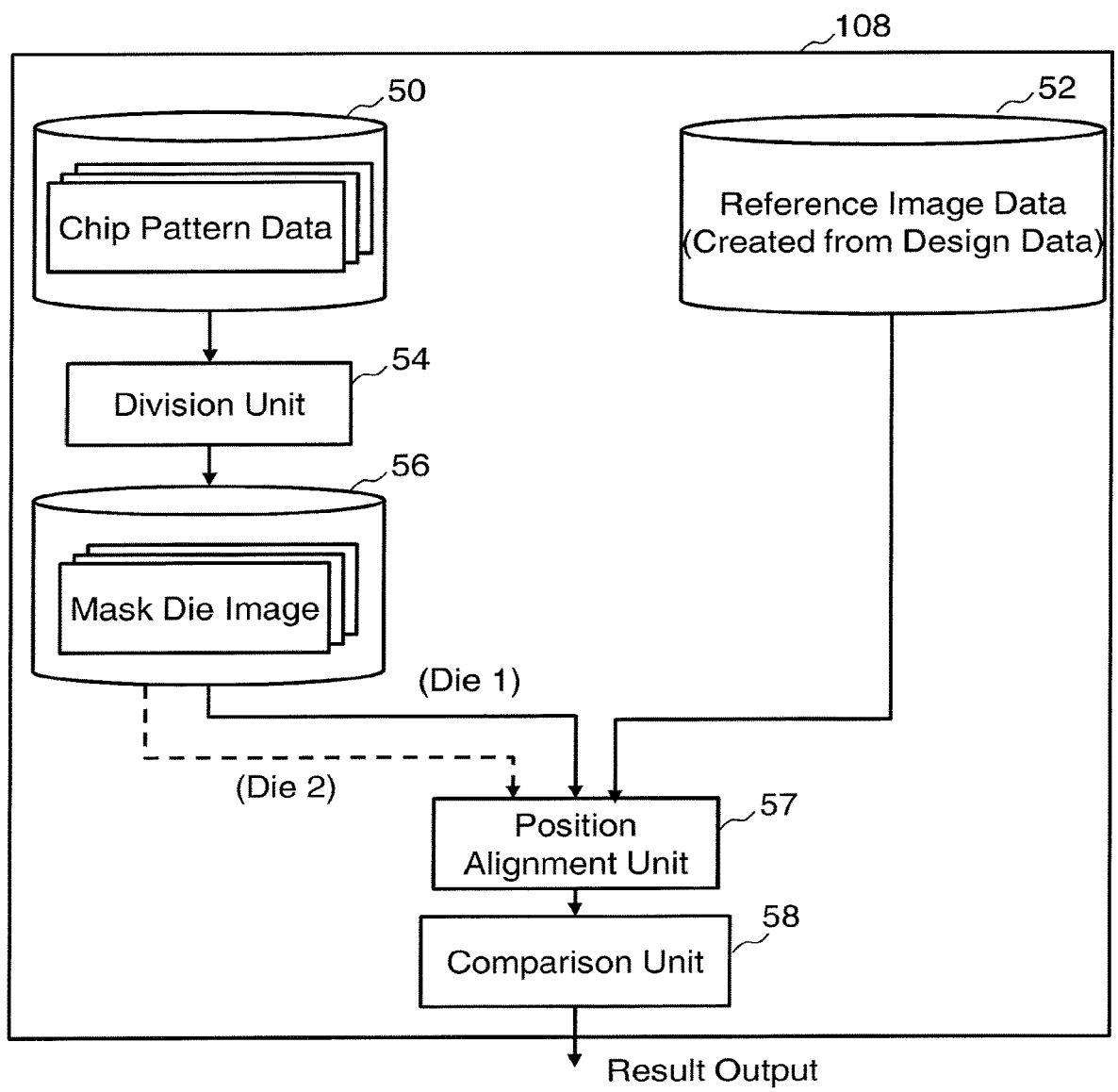
FIG. 15 is a configuration diagram illustrating an example of an internal configuration of a comparison circuit of Embodiment 1.

FIG. 15 is a configuration diagram illustrating an example of an internal configuration of the comparison circuit 108 of Embodiment 1. In FIG. 15, storage devices 50, 52, and 56 such as a magnetic disk drive, a division unit 54, a position alignment unit 57, and a comparison unit 58 are disposed in the comparison circuit 108. Each "unit" such as the division unit 54, the position alignment unit 57, and the comparison unit 58 includes a processing circuitry. Such a processing circuitry includes, for example, an electric circuit, a computer, a processor, a circuit board, a quantum circuit, or a semiconductor device. Each "unit" may use a common processing circuitry (same processing circuitry) or different processing circuitries (separate processing circuitries). Information which is input to and output from the division unit 54, the position alignment unit 57, and the comparison unit 58 and information used for calculation are stored in a memory (not illustrated) or the memory 118 at each time.

The measured chip pattern data is stored in the storage device 50. Further, the image data of the created reference image is stored in the storage device 52.

As the division step (S134), the division unit 54 divides the image of the chip pattern indicated by the chip pattern data into the images of the plurality of image acquisition regions 33 corresponding to the unit of inspection. The image (the secondary electron image, the measurement image) of the divided image acquisition region 33 is stored in the storage device 56.

As the position alignment step (S136), the position alignment unit 57 aligns a mask die image corresponding to the inspection target image to a mask die image corresponding to the reference image. For example, the position alignment is performed by using at least squares method.

As the comparison step (S138), the comparison unit 58 compares the measurement image measured from the substrate 101 with the reference image corresponding to the measurement image. Specifically, the aligned inspection target image and the reference image are compared with each other at each pixel. By comparing both images at each pixel according to a predetermined determination condition using a predetermined determination threshold value, for example, it is determined whether a defect such as a shape defect exists. For example, when a gradation value difference for each pixel is larger than the determination threshold value Th, it is determined that the pixel is a defect candidate and this determination is output as a comparison result. The comparison result may be output to the storage device 109, the monitor 117, or the memory 118 or may be output from the printer 119.

In addition to the above-described die-database inspection, the die-die inspection may be performed. In a case in which the die-die inspection is performed, the measurement image data obtained by capturing the same pattern at different places on the same substrate 101 are compared with each other. For this reason, the image acquisition mechanism 150 acquires the measurement images which are secondary electron images of one figure (first figure) and the other figure (second figure) from the substrate 101 in which the same figures (first and second figures) are formed at different positions by using the multiple beams 20 (electron beam). In such a case, the acquired measurement image of one figure becomes the reference image and the measurement image of the other figure becomes the inspection target image. The acquired images of one figure (first figure) and the other figure (second figure) may exist in the same chip pattern data or may be divided to different chip pattern data. The inspection method may be the same as that of the die-database inspection.

As described above, according to Embodiment 1, it is possible to reduce or eliminate an influence of a charge on a substrate caused by the irradiation of electron beams. Thus, it is possible to acquire an image having less distortion by reducing or eliminating the influence of the charge. For this reason, it is possible to perform an inspection with an image having less distortion by reducing or eliminating the influence of the charge.

In the description above, a series of "circuits" include a processing circuitry and the processing circuitry includes an electric circuit, a computer, a processor, a circuit board, a quantum circuit, a semiconductor device, or the like. Further, each "circuit" may use a common processing circuitry (same processing circuitry). Alternatively, a different processing circuitry (separate processing circuitry) may be used. A program that executes a processor or the like may be recorded on a record carrier body such as a magnetic disk drive, a magnetic tape device, an FD, or a read only memory (ROM). For example, the position circuit 107, the comparison circuit 108, the reference image creation circuit 112, the substrate material calculation circuit 130, the charge attenuation time calculation circuit 132, the charge influence range calculation circuit 134, and the scan sequence control circuit 136 may be configured as at least one processing circuitry.

As described above, the embodiment has been described with reference to the detailed examples. However, the invention is not limited to these detailed examples. In the example described above, the scan sequence is determined by the unit of a strip-shaped strip region and the scanning is performed according to the scan sequence, but the scan sequence is not limited thereto. Instead of the stripe shape, the scan sequence may be determined by the unit of a divided region of a plurality of divided regions obtained by dividing an inspection region and the scanning may be performed according to the scan sequence.

Further, although a part which is not directly necessary in the description of the invention, such as an apparatus configuration or a control technique has not been described, an apparatus configuration or a control technique can be appropriately selected and used when necessary.

In addition, a multiple beam image acquisition device, a multiple beam image acquisition method, an electron beam inspection apparatus, and an electron beam inspection method which can be appropriately modified in design by the person skilled in the art by including the components of the invention are included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam inspection apparatus comprising:
a stage used to place a substrate provided with a pattern thereon;
an acquisition processing circuitry configured to acquire surface material information presenting a surface material of the substrate and a value of an acceleration voltage of an electron beam;
a sequence determination processing circuitry configured to determine a scan sequence of a plurality of stripe regions on the basis of the surface material of the substrate and the value of the acceleration voltage, the plurality of stripe regions obtained by virtually dividing an inspection region of the substrate in a stripe shape;
a secondary electron image acquisition mechanism including a detector for detecting a secondary electron and configured to scan the plurality of stripe regions of the substrate according to a determined scan sequence and to acquire a secondary electron image of the substrate; and
a comparison processing circuitry configured to compare the secondary electron image with a corresponding reference image.

2. The apparatus according to claim 1, further comprising:
an attenuation time calculation processing circuitry configured to calculate an attenuation time of a charge amount in accordance with irradiation of the electron beam on the basis of the surface material of the substrate and the value of the acceleration voltage; and
a stripe number calculation processing circuitry configured to calculate the number of stripes to be scanned until the attenuation time elapses,
wherein the sequence determination processing circuitry determines the scan sequence so that stripe regions of the stripe number calculated are interposed between a target stripe region for determining a sequence and an adjacent stripe region adjacent to the target stripe region.

3. The apparatus according to claim 1, further comprising:
an influence range calculation processing circuitry configured to calculate a range of charge influence in accordance with irradiation of the electron beam on the basis of the surface material of the substrate and the value of the acceleration voltage,
wherein the sequence determination processing circuitry determines the scan sequence so that stripe regions in the range of influence are not continuous.

4. The apparatus according to claim 1,
wherein the secondary electron image acquisition mechanism acquires the secondary electron image by scanning the plurality of stripe regions using multiple electron beams.

5. The apparatus according to claim 1,
wherein the secondary electron image acquisition mechanism acquires the secondary electron image by irradiating each stripe region of the plurality of stripe regions with multiple electron beams according to a determined scan sequence and detecting secondary multiple electron beams emitted from the each stripe region.

6. The apparatus according to claim 1,
wherein the acquisition processing circuitry acquires the surface material information of the substrate for each stripe region of the plurality of stripe regions.

7. The apparatus according to claim 6,
wherein the acquisition processing circuitry acquires the value of the acceleration voltage for each stripe region of the plurality of stripe regions.

8. The apparatus according to claim 6, further comprising:
a material determination processing circuitry configured to determine the surface material of the substrate at a target stripe region by using a pattern density of the pattern formed on the substrate and an acquired surface material information of the substrate for each stripe region of the plurality of stripe regions.

9. The apparatus according to claim 8, further comprising:
an attenuation time calculation processing circuitry configured to calculate an attenuation time of a charge amount in accordance with irradiation of the electron beam on the basis of the surface material of the substrate and the value of the acceleration voltage,
wherein a determined result of the surface material of the substrate is output to the attenuation time calculation processing circuitry.

10. An electron beam inspection method comprising:
acquiring surface material information presenting a surface material of a substrate provided with a pattern and a value of an acceleration voltage of an electron beam;
determining a scan sequence of a plurality of stripe regions on the basis of the surface material of the substrate and the value of the acceleration voltage, the plurality of stripe regions obtained by virtually dividing an inspection region of the substrate in a stripe shape;
acquiring a secondary electron image of the substrate by scanning the plurality of stripe regions of the substrate according to the scan sequence determined; and
comparing the secondary electron image with a corresponding reference image and outputting a comparison result.

11. An electron beam inspection apparatus comprising:
a stage used to place a substrate provided with a pattern thereon;
an acquisition processing circuitry configured to acquire surface material information presenting a surface material of the substrate and a value of an acceleration voltage of an electron beam;
a sequence determination processing circuitry configured to determine a scan sequence of a plurality of divided regions on the basis of the surface material of the substrate and the value of the acceleration voltage, the plurality of divided regions obtained by virtually dividing an inspection region of the substrate;

a secondary electron image acquisition mechanism including a detector for detecting a secondary electron and configured to scan the plurality of divided regions of the substrate according to a determined scan sequence and to acquire a secondary electron image of the substrate; and a comparison processing circuitry configured to compare the secondary electron image with a corresponding reference image.

* * * * *